United States Patent [19]
Wakairo et al.

[11] Patent Number: 6,137,365
[45] Date of Patent: Oct. 24, 2000

[54] VARIABLE-GAIN AMPLIFIER CIRCUIT AND ATTENUATOR CIRCUIT

[75] Inventors: Hiroyuki Wakairo, Urayasu; Kazuyuki Fujiwara, Narashino, both of Japan

[73] Assignee: Nippon Precision Circuits, Inc., Japan

[21] Appl. No.: 09/137,316

[22] Filed: Aug. 20, 1998

[30] Foreign Application Priority Data

Aug. 26, 1997 [JP] Japan ......................................... 229504

[51] Int. Cl.$^7$ ................ H03G 3/12; H03G 3/10
[52] U.S. Cl. ........................................... 330/282; 330/284
[58] Field of Search ............... 330/83, 282, 307, 330/284

[56] References Cited

U.S. PATENT DOCUMENTS

| | | | |
|---|---|---|---|
| 4,132,957 | 1/1979 | Hekimian et al. | 330/51 |
| 4,354,159 | 10/1982 | Schorr et al. | 330/86 |
| 4,628,276 | 12/1986 | Mizutani | 330/86 |
| 5,175,508 | 12/1992 | Gingrich et al. | 330/282 |
| 5,663,684 | 9/1997 | Hebert | 330/307 |

*Primary Examiner*—Benny Lee
*Assistant Examiner*—Patricia T. Nguyen
*Attorney, Agent, or Firm*—Amster, Rothstein & Ebenstein

[57] ABSTRACT

There is disclosed a variable-gain circuit forming resistors on a semiconductor substrate. The ratio of the total resistance to the minimum resistance is made smaller than heretofore. The circuit is miniaturized. The variable-gain circuit comprises an operational amplifier, a first set of resistors R1–Rn+1, a second set of resistors Rx1–Rxm, switches SW1–SWn and a control circuit. This control circuit closes only one of the switches SW1–SWn at all times.

22 Claims, 42 Drawing Sheets

| resistor | ratio of resistors |
|---|---|
| R1 | 1.91 |
| R2 | 1.35 |
| R3 | 7.66 |
| Rx1 | 1.00 |
| total resistance | 11.92 |

| resistor | ratio of resistors |
|---|---|
| R1 | 1.413 |
| R2 | 1.00 |
| R3 | 7.35 |
| Rx1 | 1.057 |
| total resistance | 10.82 |

| resistor | ratio of resistors |
|---|---|
| R1 | 1.413 |
| R2 | 1.00 |
| R3 | 24.13 |
| total resistance | 26.543 |

FIG. 7A

| resistor | ratio of resistors |
|---|---|
| R1 | 1.00 |
| R2 | 8.91 |
| R3 | 120.00 |
| Rx1 | 1.37 |
| total resistance | 131.28 |

FIG. 7B

| resistor | ratio of resistors |
|---|---|
| R1 | 4.90 |
| R2 | 43.66 |
| R3 | 98.00 |
| Rx1 | 1.00 |
| total resistance | 147.56 |

FIG. 8
Prior Art

| resistor | ratio of resistors |
|---|---|
| R1 | 1.00 |
| R2 | 8.91 |
| R3 | 991.09 |
| total resistance | 1001.00 |

| resistor | ratio of resistors |
|---|---|
| R1 | 1.31 |
| R2 | 1.00 |
| R3 | 1.74 |
| R4 | 30.00 |
| Rx1 | 1.24 |
| total resistance | 35.29 |

| resistor | ratio of resistors |
|---|---|
| R1 | 5.61 |
| R2 | 4.29 |
| R3 | 1.00 |
| R4 | 73.54 |
| Rx1 | 1.53 |
| total resistance | 85.97 |

FIG. 13
Prior Art

| resistor | ratio of resistors |
|---|---|
| R1 | 1.31 |
| R2 | 1.00 |
| R3 | 1.74 |
| R4 | 128.02 |
| total resistance | 132.07 |

FIG. 14A

| resistor | ratio of resistors |
|---|---|
| R1 | 1.00 |
| R2 | 4.38 |
| R3 | 3.80 |
| R4 | 41.32 |
| Rx1 | 50.50 |
| total resistance | 101.00 |

FIG. 14B

| resistor | ratio of resistors |
|---|---|
| R1 | 1.00 |
| R2 | 8.18 |
| R3 | 8.37 |
| R4 | 10.23 |
| Rx1 | 2.33 |
| total resistance | 30.11 |

| resistor | ratio of resistors |
|---|---|
| R1 | 1.00 |
| R2 | 8.18 |
| R3 | 41.32 |
| R4 | 10.23 |
| total resistance | 60.73 |

| resistor | ratio of resistors |
|---|---|
| R1 | 2.60 |
| R2 | 5.59 |
| R3 | 1.87 |
| R4 | 5.43 |
| R5 | 2.18 |
| R6 | 3.79 |
| R7 | 7.29 |
| Rx1 | 1.58 |
| Rx2 | 1.00 |
| total resistance | 31.33 |

| resistor | ratio of resistors |
|---|---|
| R1 | 1.00 |
| R2 | 2.09 |
| R3 | 6.50 |
| R4 | 18.81 |
| R5 | 46.69 |
| R6 | 81.16 |
| R7 | 156.25 |
| total resistance | 312.50 |

| resistor | ratio of resistors |
|---|---|
| R1 | 2.42 |
| R2 | 1.78 |
| R3 | 1.35 |
| R4 | 2.15 |
| R5 | 1.00 |
| R6 | 1.34 |
| R7 | 1.57 |
| R8 | 5.60 |
| Rx1 | 2.46 |
| Rx2 | 3.49 |
| total resistance | 23.16 |

| resistor | ratio of resistors |
|---|---|
| R1 | 1.36 |
| R2 | 1.00 |
| R3 | 1.67 |
| R4 | 2.66 |
| R5 | 3.95 |
| R6 | 5.30 |
| R7 | 6.20 |
| R8 | 22.14 |
| total resistance | 44.28 |

| resistor | ratio of resistors |
|---|---|
| R1 | 1.00 |
| R2 | 4.38 |
| R3 | 3.80 |
| R4 | 18.31 |
| R5 | 22.38 |
| Rx1 | 7.31 |
| total resistance | 57.18 |

| resistor | ratio of resistors |
|---|---|
| R1 | 1.19 |
| R2 | 5.23 |
| R3 | 1.00 |
| R4 | 10.86 |
| R5 | 13.27 |
| Rx1 | 1.81 |
| total resistance | 33.36 |

| resistor | ratio of resistors |
|---|---|
| R1 | 1.00 |
| R2 | 4.38 |
| R3 | 3.80 |
| R4 | 41.32 |
| R5 | 50.50 |
| total resistance | 101.00 |

| resistor | ratio of resistors |
|---|---|
| R1 | 1.73 |
| R2 | 1.64 |
| R3 | 1.83 |
| R4 | 1.22 |
| R5 | 8.65 |
| Rx1 | 1.00 |
| total resistance | 16.07 |

| resistor | ratio of resistors |
|---|---|
| R0 | 1.42 |
| R1 | 1.34 |
| R2 | 1.49 |
| R3 | 1.00 |
| R4 | 4.35 |
| R5 | 4.72 |
| Rx1 | 1.04 |
| total resistance | 15.36 |

| resistor | ratio of resistors |
|---|---|
| R1 | 1.41 |
| R2 | 1.34 |
| R3 | 1.49 |
| R4 | 1.00 |
| R5 | 52.48 |
| total resistance | 57.72 |

FIG. 38

| resistor | ratio of resistors |
|---|---|
| R1 | 3.13 |
| R2 | 6.75 |
| R3 | 2.09 |
| R4 | 6.56 |
| R5 | 1.90 |
| R6 | 5.51 |
| R7 | 2.21 |
| R8 | 3.85 |
| R9 | 7.41 |
| Rx1 | 1.61 |
| Rx2 | 1.00 |
| Rx3 | 1.08 |
| total resistance | 43.10 |

| resistor | ratio of resistors |
|---|---|
| R1 | 1.00 |
| R2 | 2.23 |
| R3 | 7.10 |
| R4 | 21.61 |
| R5 | 67.10 |
| R6 | 194.19 |
| R7 | 481.94 |
| R8 | 837.74 |
| R9 | 1612.90 |
| total resistance | 3225.81 |

| resistor | ratio of resistors |
|---|---|
| R1 | 7.66 |
| R2 | 1.35 |
| R3 | 1.91 |
| Rx1 | 1.00 |
| total resistance | 11.92 |

| resistor | ratio of resistors |
|---|---|
| R1 | 7.35 |
| R2 | 1.00 |
| R3 | 1.413 |
| Rx1 | 1.057 |
| total resistance | 10.82 |

| resistor | ratio of resistors |
|---|---|
| R1 | 24.13 |
| R2 | 1.00 |
| R3 | 1.413 |
| total resistance | 26.543 |

FIG. 47A

| resistor | ratio of resistors |
|---|---|
| R1 | 120.00 |
| R2 | 8.91 |
| R3 | 1.00 |
| Rx1 | 1.37 |
| total resistance | 131.28 |

FIG. 47B

| resistor | ratio of resistors |
|---|---|
| R1 | 98.00 |
| R2 | 43.66 |
| R3 | 4.90 |
| Rx1 | 1.00 |
| total resistance | 147.56 |

FIG. 48

| resistor | ratio of resistors |
|---|---|
| R1 | 991.09 |
| R2 | 8.91 |
| R3 | 1.00 |
| total resistance | 1001.00 |

| resistor | ratio of resistors |
|---|---|
| R1 | 30.00 |
| R2 | 1.74 |
| R3 | 1.00 |
| R4 | 1.31 |
| Rx1 | 1.24 |
| total resistance | 35.29 |

| resistor | ratio of resistors |
|---|---|
| R1 | 73.54 |
| R2 | 1.00 |
| R3 | 4.29 |
| R4 | 5.61 |
| Rx1 | 1.53 |
| total resistance | 85.97 |

FIG. 53

Prior Art

| resistor | ratio of resistors |
|---|---|
| R1 | 128.02 |
| R2 | 1.74 |
| R3 | 1.00 |
| R4 | 1.31 |
| total resistance | 132.07 |

FIG. 54A

| resistor | ratio of resistors |
|---|---|
| R1 | 10.23 |
| R2 | 41.32 |
| R3 | 8.18 |
| R4 | 1.00 |
| Rx1 | 12.82 |
| total resistance | 73.55 |

FIG. 54B

| resistor | ratio of resistors |
|---|---|
| R1 | 10.23 |
| R2 | 8.37 |
| R3 | 8.18 |
| R4 | 1.00 |
| Rx1 | 2.33 |
| total resistance | 30.11 |

| resistor | ratio of resistors |
|---|---|
| R1 | 50.50 |
| R2 | 41.32 |
| R3 | 8.18 |
| R4 | 1.00 |
| total resistance | 101.00 |

| resistor | ratio of resistors |
|---|---|
| R1 | 7.29 |
| R2 | 3.79 |
| R3 | 2.18 |
| R4 | 5.43 |
| R5 | 1.87 |
| R6 | 5.59 |
| R7 | 2.60 |
| Rx1 | 1.58 |
| Rx2 | 1.00 |
| total resistance | 31.33 |

| resistor | ratio of resistors |
|---|---|
| R1 | 156.25 |
| R2 | 81.16 |
| R3 | 46.69 |
| R4 | 18.81 |
| R5 | 6.50 |
| R6 | 2.09 |
| R7 | 1.00 |
| total resistance | 312.50 |

| resistor | ratio of resistors |
|---|---|
| R1 | 5.60 |
| R2 | 1.57 |
| R3 | 1.34 |
| R4 | 1.00 |
| R5 | 2.15 |
| R6 | 1.35 |
| R7 | 1.78 |
| R8 | 2.42 |
| Rx1 | 2.46 |
| Rx2 | 3.49 |
| total resistance | 23.16 |

| resistor | ratio of resistors |
|---|---|
| R1 | 22.14 |
| R2 | 6.20 |
| R3 | 5.30 |
| R4 | 3.95 |
| R5 | 2.66 |
| R6 | 1.67 |
| R7 | 1.00 |
| R8 | 1.36 |
| total resistance | 44.28 |

| resistor | ratio of resistors |
|---|---|
| R1 | 22.38 |
| R2 | 18.31 |
| R3 | 3.80 |
| R4 | 4.38 |
| R5 | 1.00 |
| Rx1 | 7.31 |
| total resistance | 57.18 |

| resistor | ratio of resistors |
|---|---|
| R1 | 13.27 |
| R2 | 10.86 |
| R3 | 1.00 |
| R4 | 5.23 |
| R5 | 1.19 |
| Rx1 | 1.81 |
| total resistance | 33.36 |

| resistor | ratio of resistors |
|---|---|
| R1 | 50.50 |
| R2 | 41.32 |
| R3 | 3.80 |
| R4 | 4.38 |
| R5 | 1.00 |
| total resistance | 101.00 |

| resistor | ratio of resistors |
|---|---|
| R1 | 8.65 |
| R2 | 1.22 |
| R3 | 1.83 |
| R4 | 1.64 |
| R5 | 1.73 |
| Rx1 | 1.00 |
| total resistance | 16.07 |

| resistor | ratio of resistors |
|---|---|
| R0 | 4.72 |
| R1 | 4.35 |
| R2 | 1.00 |
| R3 | 1.49 |
| R4 | 1.34 |
| R5 | 1.42 |
| Rx1 | 1.04 |
| total resistance | 15.36 |

| resistor | ratio of resistors |
|---|---|
| R1 | 52.48 |
| R2 | 1.00 |
| R3 | 1.49 |
| R4 | 1.34 |
| R5 | 1.41 |
| total resistance | 57.72 |

| resistor | ratio of resistors |
|---|---|
| R1 | 7.41 |
| R2 | 3.85 |
| R3 | 2.21 |
| R4 | 5.51 |
| R5 | 1.90 |
| R6 | 6.56 |
| R7 | 2.09 |
| R8 | 6.75 |
| R9 | 3.13 |
| Rx1 | 1.61 |
| Rx2 | 1.00 |
| Rx3 | 1.08 |
| total resistance | 43.10 |

| resistor | ratio of resistors |
|---|---|
| R1 | 1612.90 |
| R2 | 837.74 |
| R3 | 481.94 |
| R4 | 194.19 |
| R5 | 67.10 |
| R6 | 21.61 |
| R7 | 7.10 |
| R8 | 2.23 |
| R9 | 1.00 |
| total resistance | 3225.81 |

VARIABLE-GAIN AMPLIFIER CIRCUIT AND ATTENUATOR CIRCUIT

FIELD OF THE INVENTION

The present invention relates to a variable-gain amplifier circuit and a variable-gain attenuator circuit.

BACKGROUND OF THE INVENTION

A variable-gain amplifier or attenuator circuit as shown in FIG. 81 has been heretofore adopted as a volume-adjusting device in audio equipment, TV receivers, communications equipment, etc. to control the volume of an analog audio signal. This circuit comprises resistors R1–Rn+1, an operational amplifier 101, and transistor switches Sw1–Swn controlled by a control circuit 102.

In brief, when a transistor Swi is conducting, no current is fed into the inverting input terminal of the operational amplifier 101 and so a terminal i is placed at the same potential as the inverting input terminal, forming a circuit equivalent to a circuit shown in FIG. 82. At this time, the ON resistance of the switch Swi is independent of the gain.

In FIG. 82, resistances ri and rf are respectively given by $$ri = R1 + R2 + \cdots + Ri$$

$$rf = Ri+1 + \cdots + Rn + Rn+1$$

At this time, the gain Gi (dB), i.e., the ratio of the output voltage Vout to the input voltage Vin, is given by $$G_i = 20 * \text{Log}_{10}\left(\frac{V_{out}}{V_{in}}\right) = 20 * \text{Log}_{10}\left(\frac{r_f}{r_i}\right) = 20 * \text{Log}_{10}\left(\frac{R_{i+1} + \ldots + R_n + R_{n+1}}{R_1 + R_2 + \ldots + R_i}\right) \quad (1)$$

It can be seen from Eq. (1) above that R1–Rn+1 are determined by the desired gain providing either amplification or attenuation that is obtained by selectively closing the switches. This circuit is fabricated often using semiconductor devices to miniaturize the circuit.

If large amplification or large attenuation should be obtained by the gain of the circuit described above, or if the steps of gain are reduced, the ratio of the total resistance to the minimum resistance becomes exorbitantly large. Especially, where the circuit described above is fabricated using semiconductor devices, limitations are frequently imposed on the minimum size of the minimum resistor due to the limited ability to miniaturize resistive elements fabricated and due to limited accuracy achieved. Therefore, as the minimum resistance increases, the area of the whole resistance increases, thus increasing the dimensions of the circuit.

Furthermore, when it is attempted to make the amplification or attenuation as large as possible by the gain of the circuit, the area of the resistor increases. Thus, the limitations placed on the circuit scale have made it impossible to produce large degrees of amplification or attenuation.

The relation of the total resistance to the minimum resistance of the prior art circuit shown in FIG. 81 is next described about the case where the circuit is used for amplification and about the case where the circuit is used for attenuation.

It is first assumed that the circuit shown in FIG. 81 is used as an amplifier circuit having a variable gain. A desired gain providing amplification is derived by selectively closing the switches. Which of the resistors R1–Rn+1 gives the minimum resistance varies, depending on the number of the switches and on the desired gain. For example, where the gain is changed in negative equal steps a (dB) as is often used, R1 or R2 often becomes the minimum resistance. Under this condition, the above-described relation is expressed as described below.

It is now assumed that when the switches S1 and S2 are closed, voltage gains of G1 and G2 are respectively produced (G2=G1+a). Thus, these gains can be respectively expressed as follows.

$$G_1 = 20 * \text{Log}_{10}\left(\frac{R_2 + \ldots + R_{n+1}}{R_1}\right) = 20 * \text{Log}_{10}\left(\frac{R_{all} - R_1}{R_1}\right) \quad (2)$$

$$G_2 = 20 * \text{Log}_{10}\left(\frac{R_3 + \ldots + R_{n+1}}{R_1 + R_2}\right) = 20 * \text{Log}_{10}\left(\frac{R_{all} - (R_1 + R_2)}{R_1 + R_2}\right) \quad (3)$$

Note that G1 is the maximum gain of this circuit. When R1 is the minimum resistance, if the total resistance Rall is expressed in terms of the minimum resistance R1, we have $$R_{all} = \left(1 + 10^{\frac{G_1}{20}}\right) * R_1 \quad (4)$$

Notice that R1 is the minimum resistance where the following relation holds:

$$G_1 > 20 * \text{Log}_{10}\left(2 * 10^{\frac{G_2}{20}} + 1\right) \quad (5)$$

When R2 is the minimum resistance, if the total resistance Rall is expressed in terms of the minimum resistance R2, the total resistance is given by $$R_{all} = \left\{\frac{\left(1 + 10^{\frac{G_1}{20}}\right) * \left(1 + 10^{\frac{G_2}{20}}\right)}{10^{\frac{G_1}{20}} - 10^{\frac{G_2}{20}}}\right\} * R_2 \quad (6)$$

If the relationship $$G_1 < 20 * \text{Log}_{10}\left(2 * 10^{\frac{G_2}{20}} + 1\right) \quad (7)$$

holds, R2 gives the minimum resistance.

For example, where G1=50 dB and G2=40 dB (gain step=−10 dB), Eq. (5) holds and, therefore, R1 becomes the minimum resistance. Eq. (4) leads to Rall=317.2×R1. Consequently, the total resistance must be 317.2 times as large as the minimum resistance.

Where G1=60 dB and G2=59 dB (gain step=−1 dB), Eq. (7) holds and, therefore, R2 becomes the minimum resistance. Eq. (6) leads to Rall=8212.9×R2. Consequently, the total resistance must be 8212.9 times as large as the minimum resistance. In this way, the ratio of the total resistance to the minimum resistance is very large.

Generally, however, when an amplifier circuit is designed, allowances are given to the ideal gain providing amplification. Therefore, the values of Rall derived from Eqs. (4) and (6) involve errors.

An example that the circuit shown in FIG. 81 is used as a variable-gain circuit providing attenuation is next described. Again, which of the resistors R1–Rn+1 gives the minimum resistance varies, depending on the number of the switches and on the desired attenuation produced by selectively closing the switches. For example, where the gain is varied in negative equal steps a (dB) as is often used, Rn or Rn+1 often becomes the minimum resistance. This situation is next described.

It is now assumed that when the switches SWn−1 and SWn are closed, voltage gains of Gn−1 and Gn are respectively produced (Gn=Gn−1+a). Thus, these gains can be respectively expressed as follows.

$$G_{n-1} = \qquad (8)$$
$$20*\text{Log}_{10}\left(\frac{R_n + R_{n+1}}{R_1 + R_2 + \ldots + R_{n-1}}\right) = 20*\text{Log}_{10}\left(\frac{R_n + R_{n+1}}{R_{all} - (R_n + R_{n+1})}\right)$$

$$G_n = 20*\text{Log}_{10}\left(\frac{R_{n+1}}{R_1 + R_2 + \ldots + R_n}\right) = 20*\text{Log}_{10}\left(\frac{R_{n+1}}{R_{all} - R_{n+1}}\right) \qquad (9)$$

where Gn is the maximum attenuation provided by the gain of this circuit. When Rn+1 is the minimum resistance, expressing the total resistance Rall in terms of the minimum resistance Rn+1 gives rise to $$R_{all} = \left(1 + \frac{1}{10^{\frac{G_n}{20}}}\right) * R_{n+1} \qquad (10)$$

Note that Rn+1 gives the minimum resistance provided that the following relation holds:

$$G_n < 20*\text{Log}_{10}\left(\frac{10^{\frac{G_{n+1}}{20}}}{2 + 10^{\frac{G_{n-1}}{20}}}\right) \qquad (11)$$

When Rn gives the minimum resistance, expressing the total resistance Rall in terms of Rn results in $$R_{all} = \left(\frac{\left(1 + 10^{\frac{G_{n-1}}{20}}\right)*\left(1 + 10^{\frac{G_n}{20}}\right)}{10^{\frac{G_{n-1}}{20}}*\left(1 + 10^{\frac{G_n}{20}}\right) - \left(1 + 10^{\frac{G_{n-1}}{20}}\right)*10^{\frac{G_n}{20}}}\right) * R_n \qquad (12)$$

If the relationship $$G_n > 20*\text{Log}_{10}\left(\frac{10^{\frac{G_{n-1}}{20}}}{2 + 10^{\frac{G_{n-1}}{20}}}\right) \qquad (13)$$

holds, Rn gives the minimum resistance.

For example, where Gn−1=−40 dB and Gn=−50 dB (gain step=−10 dB), Eq. (11) holds and, therefore, Rn+1 gives the minimum resistance. Eq. (10) leads to Rall=317.2×Rn+1. Consequently, the total resistance must be 317.2 times as large as the minimum resistance.

Where Gn−1=−59 dB and Gn=−60 dB (gain step=−1 dB), Eq. (13) holds and, therefore, Rn gives the minimum resistance. Eq. (12) leads to Rall=8212.9×Rn. Consequently, the total resistance must be 8212.9 times as large as the minimum resistance. In this manner, the ratio of the total resistance to the minimum resistance is increased greatly.

Generally, however, when an amplifier circuit is designed, allowances are given to the ideal gain providing amplification. Therefore, the values of Rall derived from Eqs. (10) and (12) involve errors.

In the examples given above, the gain is variable and changes in equal steps. Even where the gain step is not uniform, the ratio of the total resistance to the minimum resistance is very large in the configuration described above.

SUMMARY OF THE INVENTION

It is an object of the present invention to provide a variable-gain amplifier circuit free of the foregoing problems.

It is another object of the invention to provide a variable-gain attenuator circuit free of the foregoing problems.

The present invention provides a variable-gain amplifier circuit comprising: an operational amplifier having a gain and equipped with an inverting input terminal and an output terminal; a first set of resistors fabricated on a semiconductor substrate, the resistors being connected in series; a second set of resistors fabricated on the semiconductor substrate; and a control means. A respective one end of the resistors of the first set is connected with the output terminal of the operational amplifier. The other end forms a signal-input terminal of the variable-gain amplifier circuit. All or some of the junctions of the resistors of the first set can be connected with the inverting input terminal of the operational amplifier and are referred to as the first connectable junctions. A respective one end of the resistors of the second set is connected with the signal-input terminal, while the other end is connected with a respective one of the junctions of the resistors of the first set. The control means controls connection of the first connectable junctions with the inverting input terminal, thus controlling the gain of the operational amplifier. Where the variable-gain amplifier circuit is set at a large gain, or where the gain step should be reduced, the ratio of the total resistance to the minimum resistance can be made small. Hence, the circuit area can be reduced greatly.

The present invention also provides a variable-gain attenuator circuit comprising: an operational amplifier having a gain and equipped with an inverting input terminal and an output terminal; a first set of resistors fabricated on a semiconductor substrate, the resistors being connected in series; a second set of resistors fabricated on the semiconductor substrate; and a control means. A respective one end of the resistors of the first set is connected with the output terminal of the operational amplifier. The other end forms a signal-input terminal of the variable-gain attenuator circuit. All or some of the junctions of the resistors of the first set can be connected with the inverting input terminal of the operational amplifier and are referred to as the first connectable junctions. A respective one end of the resistors of the second set is connected with the output terminal of the operational amplifier, while the other end is connected with a respective one of the junctions of the resistors of the first set. The control means controls connection of the first connectable junctions with the inverting input terminal, thus controlling the gain of the operational amplifier. Where the variable-gain attenuator circuit is set at a large gain, or where the gain step should be reduced, the ratio of the total resistance to the minimum resistance can be made small. Hence the circuit area can be reduced greatly.

Other objects and features of the invention will appear in the course of the description thereof, which follows.

BRIEF DESCRIPTION OF THE DRAWINGS

FIGS. 7A and 7B are tables showing the resistance ratios of resistors included in the circuit shown in FIG. 3;

FIG. 8 is a table showing the resistance ratios of resistors included in the circuit shown in FIG. 5;

FIG. 13 is a table showing the resistance ratios of resistors included in the circuit shown in FIG. 12;

FIGS. 14A and 14B are tables showing the resistance ratios of resistors included in the circuits shown in FIGS. 9 and 10, respectively;

FIG. 38 is a table showing the resistance ratios of resistors included in the circuit shown in FIG. 37;

FIGS. 47A and 47B are tables showing the resistance ratios of resistors included in the circuit shown in FIG. 43;

FIG. 48 is a table showing the resistance ratios of resistors included in the circuit shown in FIG. 45;

FIG. 53 is a table showing the resistance ratios of resistors included in the circuit shown in FIG. 52;

FIGS. 54A and 54B are tables showing the resistance ratios of resistors included in the circuits shown in FIGS. 49 and 50, respectively;

DETAILED DESCRIPTION OF THE PREFERRED EMBODIMENTS

Figure 1:
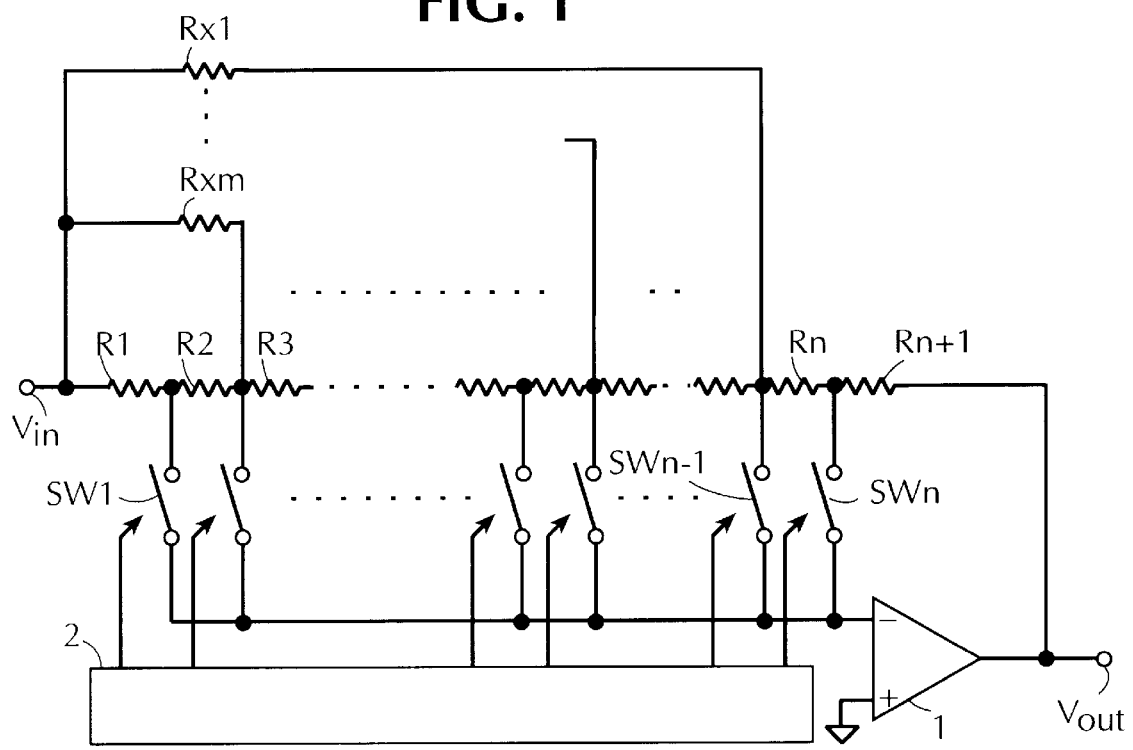
FIG. 1 is a circuit diagram of a variable-gain amplifier circuit in accordance with the present invention.

A variable-gain amplifier circuit in accordance with the present invention is first described. A general example of this variable-gain amplifier circuit is shown in FIG. 1. This circuit comprises an operational amplifier 1, a first set of resistors R1–Rn+1, a second set of resistors Rx1–Rxm, switches SW1–SWn, a control circuit 2 that forms a control means and controls the switches SW1–SWn and other elements. The control circuit 2 closes only one of the switches SW1–SWn. The resistors Rx1–Rxm are fabricated on a semiconductor substrate, and generally consist of poly silicon, thin-film resistors, diffused resistors, or other resistive elements. In this embodiment, all the junctions of the resistors R1–Rn+1 can be connected with the inverting input terminal of the operational amplifier 1 by the switches SW1–SWn.

Figure 2:
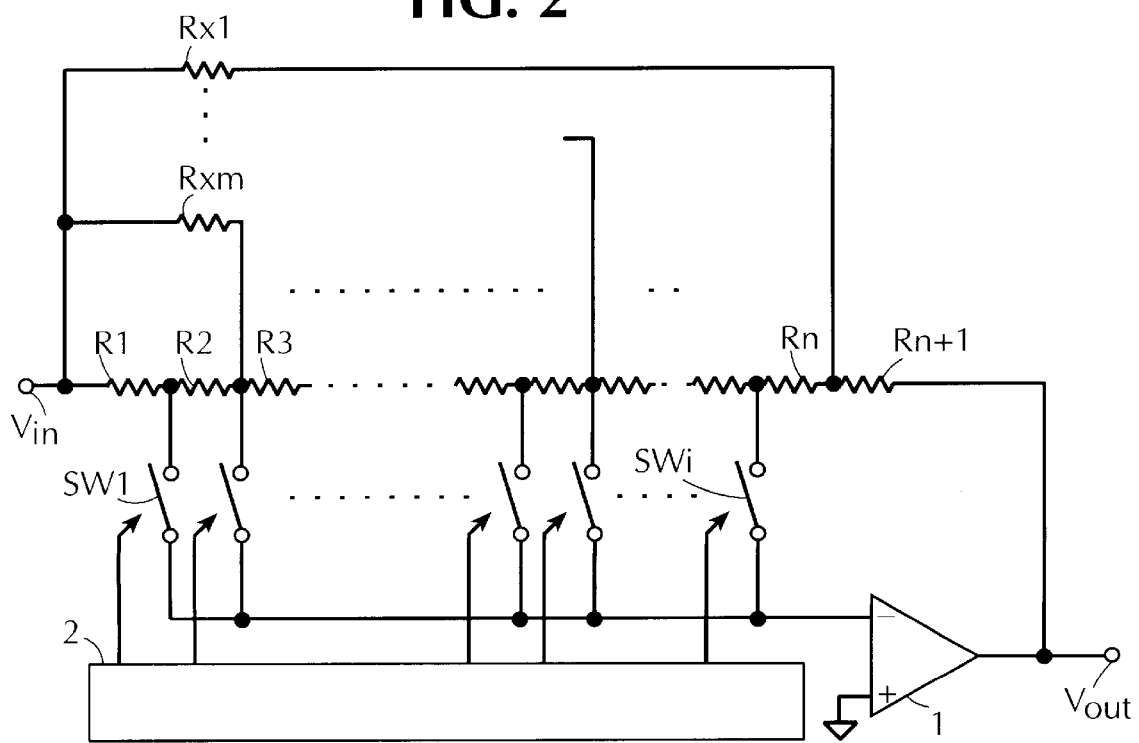
FIG. 2 is a circuit diagram of another variable-gain amplifier circuit in accordance with the invention.

Another general example of the variable-gain amplifier circuit is shown in FIG. 2. This circuit comprises an operational amplifier 1, a first set of resistors R1–Rn+1, a second set of resistors Rx1–Rxm, switches SW1–SWi, a control circuit 2 forming a control means and controlling the switches SW1–SWi and other components. Also, in this case, the control circuit 2 closes only one of the switches SW1–SWi at all times. In this embodiment, some of the resistors of the second set are connected with the junctions of the resistors to which no switches are connected. Specific examples of the circuits shown in FIGS. 1 and 2 are given below.

First, a specific example of the circuit shown in FIG. 1 is described. For simplicity, it is assumed that the first set of resistors consists of three resistors and that two switches are mounted. This is described in detail by referring to FIG. 3.

In this example, the first set of resistors consists of resistors R1, R2 and R3 connected in series. One end of the resistor R3 is connected with the output of the operational amplifier 1. One end of the resistor R1 is connected with a signal-input terminal Vin. The second set of resistors consists of a resistor Rx1. One end of this resistor Rx1 is connected with the signal-input terminal Vin, while the other end is connected with the junction of the resistors R2 and R3. A switch SW1 is inserted between the junction of the resistors R1 and R2 and the inverting input terminal of the amplifier 1. Another switch SW2 is inserted between the junction of the resistors R2 and R3 and the inverting input terminal of the amplifier 1. It is to be noted that the same components are indicated by the same reference numerals in various figures.

Figures 3, 4A, 4B:
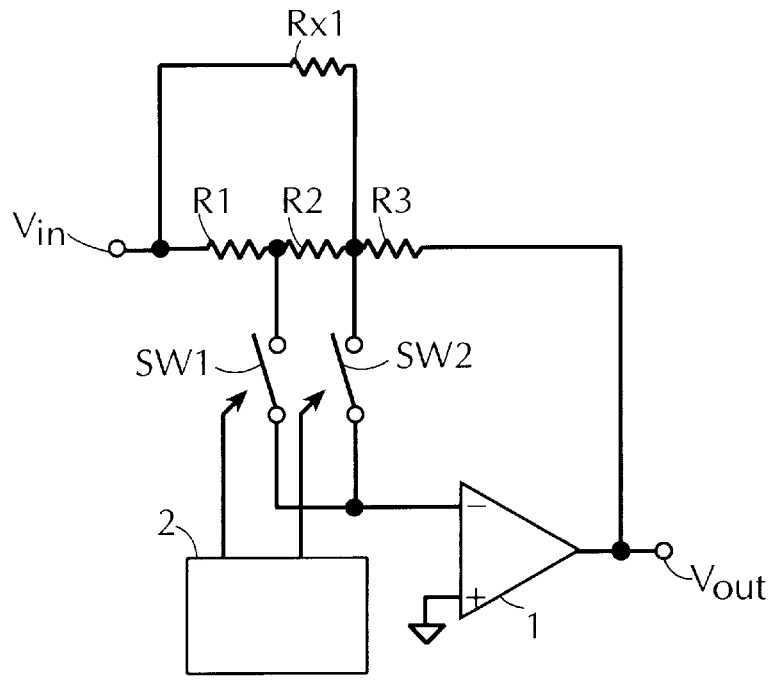
FIG. 3 is a circuit diagram of a specific example of the variable-gain amplifier circuit shown in FIG. 1.
FIGS. 4A and 4B are tables showing the resistance ratios of resistors included in the circuit shown in FIG. 3.

In this configuration, where ideal gains of 25 dB and 20 dB should be obtained by closing the switches SW1 and SW2, respectively, the resistance ratios of the resistors R1, R2, R3 and Rx1 should be set as listed in the tables of FIGS. 4(a) and 4(b), respectively. These various resistance ratios are obtained where the minimum resistance is set to 1. Generally, however, the ideal gains derived from the determined resistance ratios and providing amplification should be given allowances. In this and the following examples, the gains determined for the ideal gains permit allowances of ±0.2 dB.

Figures 5, 6:
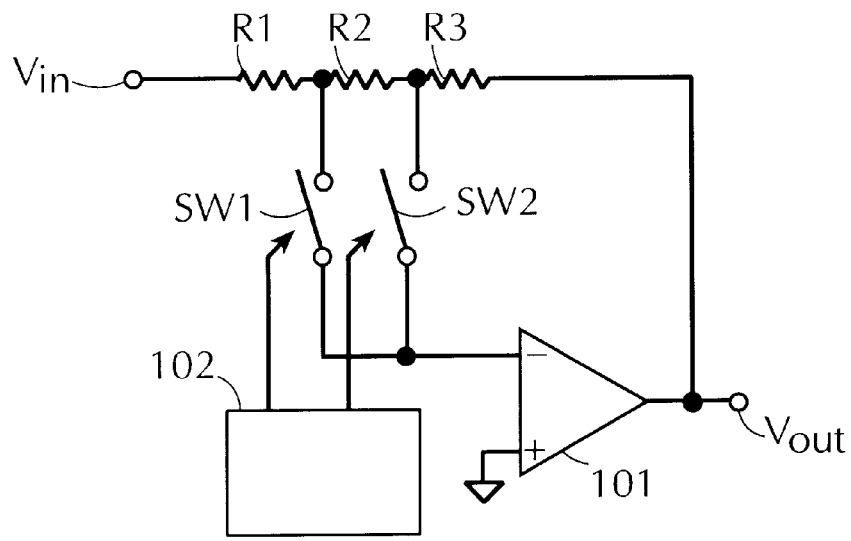
FIG. 5 is a diagram of a circuit that is equivalent to the circuit shown in FIG. 3 but fabricated by the prior art technique.
FIG. 6 is a table showing the resistance ratios of resistors included in the circuit shown in FIG. 5.

A comparative example is given in FIG. 5, and comprises a circuit that has the same gain as the circuit shown in FIG. 3 but fabricated by the prior art technique. In this case, Eq. (5) above holds. The resistor R2 becomes the minimum resistance. The resistance values of the resistors are given in the table of FIG. 6. The resistance ratios of the various resistors are found, assuming that the minimum resistance is 1, in the same way as in FIGS. 4(a) and 4(b).

As can be seen by comparison of the total resistances given in Tables of FIGS. 4(a), 4(b) and 6, the required total resistance in the present embodiment can be set about 11.9 or 10.8 times as large as the minimum resistance, while the total resistance required for the prior art configuration is about 26.5 times as large as the minimum resistance. Therefore, the area of the circuit occupied by the resistors can be reduced greatly. Where the same area is used for the resistors as in the prior art technique, greater gains providing amplification can be obtained.

In the configuration shown in FIG. 3, if ideal gains of 60 dB and 40 dB should be obtained by closing the switch SW1 and SW2, respectively, the resistance ratios of the resistors R1, R2, R3 and Rx1 should be set as listed in the tables of FIGS. 7(a) and 7(b), respectively. These various resistance ratios are obtained where the minimum resistance is set to 1.

Where the same gains providing amplification as the foregoing should be obtained using the circuit shown in FIG. 5, Eq. (7) above holds. The resistor R1 becomes the minimum resistance. The resistance values of the various resistors are listed in the table of FIG. 8. The resistance ratios of the various resistors are found, assuming that the minimum resistance is 1, in the same way as in FIG. 4.

As can be seen by comparison of the total resistances given in Tables of FIGS. 7(a), 7(b) and 8, the required total resistance in the present embodiment can be set about 131.3 or 147.6 times as large as the minimum resistance, while the total resistance required for the prior art configuration is 1001 times as large as the minimum resistance. Therefore, the area of the circuit occupied by the resistors can be reduced greatly. Where the same area is used for the resistors as in the prior art technique, greater gains providing amplification can be obtained.

Figure 9:
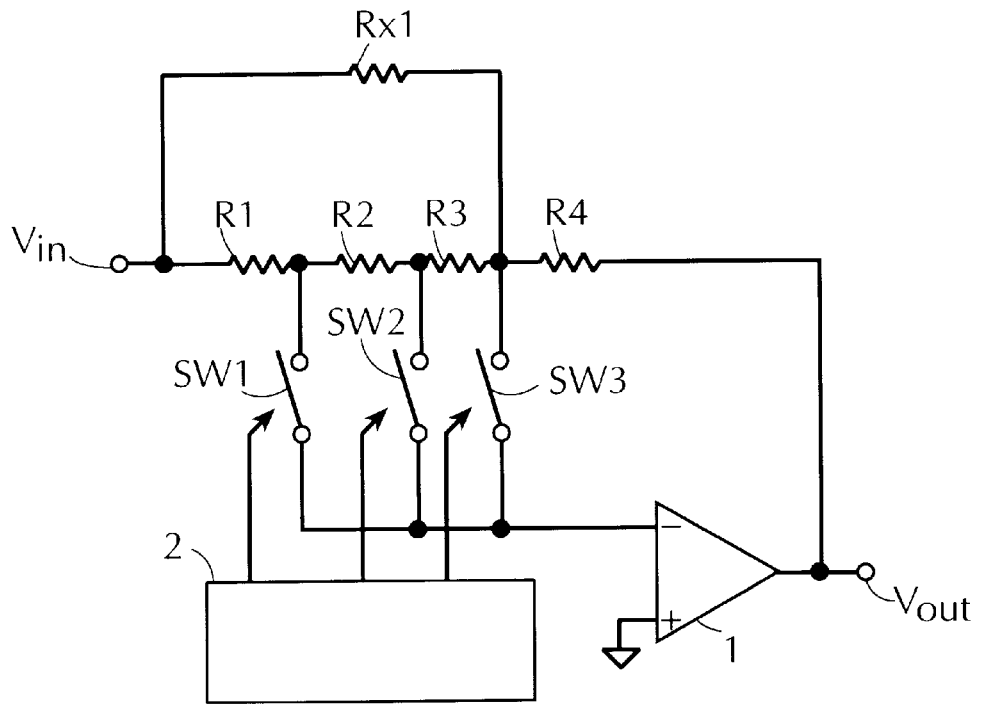
FIG. 9 is a diagram of another circuit in accordance with the invention.
Figure 10:
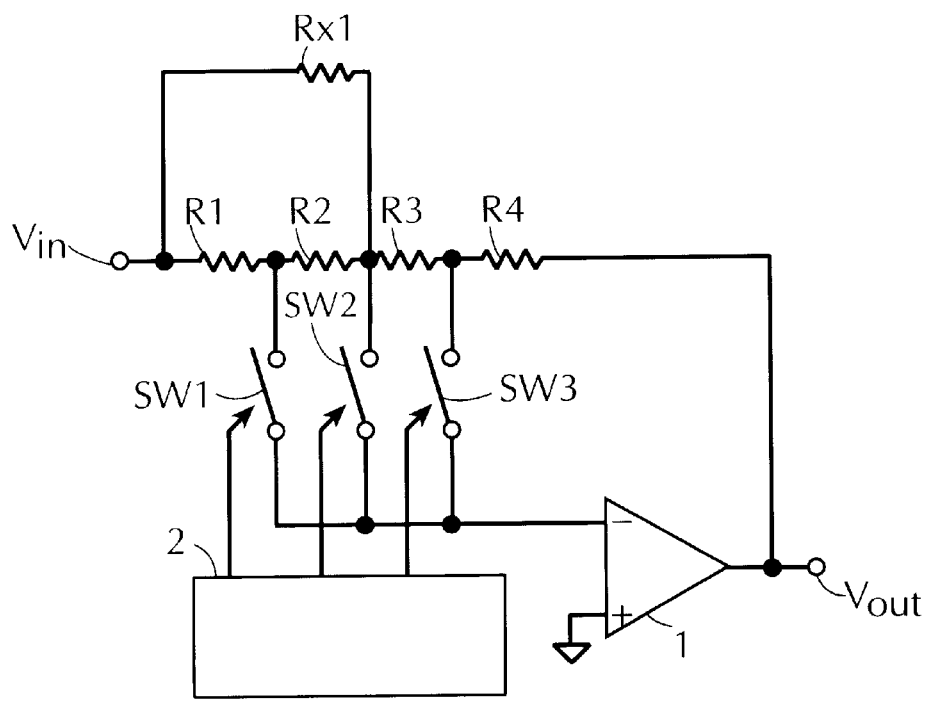
FIG. 10 is a diagram of a further circuit in accordance with the invention.

Examples in which four resistors are used as the first set of resistors and three switches are mounted are next described in detail by referring to FIGS. 9 and 10.

In FIGS. 9 and 10, the first set of resistors consists of resistors R1, R2, R3 and R4 connected in series. One end of the resistor R4 is connected with the output of an operational amplifier 1. One end of the resistor R1 is connected with a signal-input terminal Vin.

In FIG. 9, the second set of resistors consists of a resistor Rx1 whose one end is connected with a signal-input terminal Vin, the other end being connected with the junction of the resistors R3 and R4. A switch SW1 is inserted between the junction of the resistors R1 and R2 and the inverting input terminal of the operational amplifier 1. Another switch SW2 is connected between the junction of the resistors R2 and R3 and the inverting input terminal of the amplifier 1. A further switch SW3 is placed between the junction of the resistors R3 and R4 and the inverting input terminal of the amplifier 1.

In FIG. 10, the second set of resistors consists of a resistor Rx1 whose one end is tied to a signal-input terminal Vin, the other being connected with the junction of the resistors R2 and R3. A switch SW1 is connected between the junctions of the resistors R1 and R2 and the inverting input terminal of the operational amplifier 1. Another switch SW2 is inserted between the junction of the resistors R2 and R3 and the inverting input terminal of the amplifier 1. A further switch SW3 is placed between the junction of the resistors R3 and R4 and the inverting input terminal of the amplifier 1.

Figures 11A, 11B, 12:
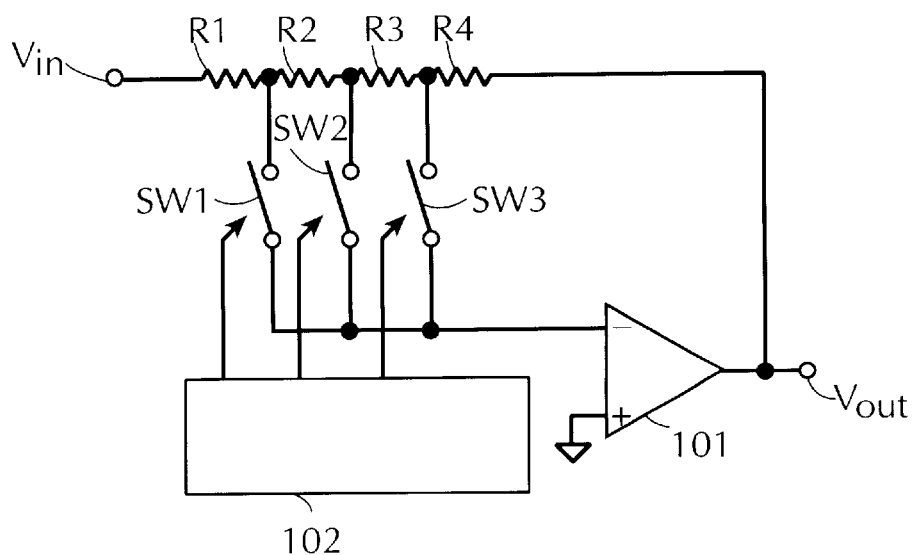
FIGS. 11A and 11B are tables showing the resistance ratios of resistors included in the circuits shown in FIGS. 9 and 10, respectively.
FIG. 12 is a diagram of a circuit that is equivalent to the circuits shown in FIGS. 9 and 10 but fabricated by the prior art technique.

In this configuration, where ideal gains of 40 dB, 35 dB and 30 dB should be obtained by closing the switch SW1, SW2 and SW3, respectively, the resistance ratios of the resistors R1, R2, R3, R4 and Rx1 should be set, for example, as listed in the tables of FIGS. 11(a) and 11(b). The table of FIG. 11(a) shows an example of adopting the structure of FIG. 9. The table of FIG. 11(b) shows an example of adopting the structure of FIG. 10. In either case, the various resistance ratios are obtained under the condition that the minimum resistance is set to 1.

Where the prior art technique is used, the circuit is designed as shown in FIG. 12. Where the same ideal gains should be obtained as the foregoing, Eq. (5) above holds.

The resistor R2 becomes the minimum resistance. The resistance values of the various resistors are listed in the table of FIG. 13. The resistance ratios are found, assuming that the minimum resistance is 1, in the same way as in FIG. 4.

In the configurations shown in FIGS. 9 and 10, where ideal gains of 40 dB, 20 dB and 0 dB should be obtained by closing the switch SW1, SW2 and SW3, respectively, the resistance ratios of the resistors R1, R2, R3, R4 and Rx1 should be set as listed in the tables of FIGS. 14(a) and 14(b). Also, in this case, the various resistance ratios are obtained under the condition that the minimum resistance is set to 1.

Where the same ideal gains as the foregoing should be obtained, using the circuit shown in FIG. 12, to provide amplification, Eq. (7) holds, and the resistor R1 becomes the minimum resistance. The various resistors assume resistance values as listed in the table of FIG. 15. Again, the various resistance values are found, assuming that the minimum resistance is 1.

Figures 15, 16:
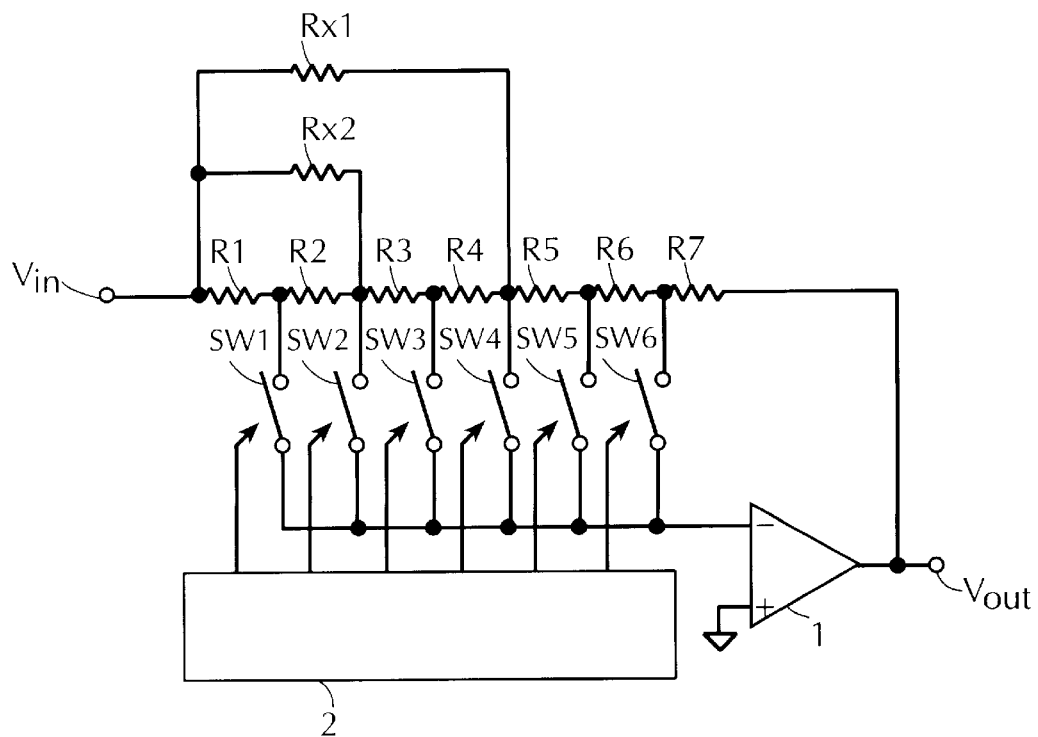
FIG. 15 is a table showing the resistance ratios of resistors included in the circuit shown in FIG. 12.
FIG. 16 is a diagram of a yet other circuit in accordance with the invention.

An example in which seven resistors are used as the first set of resistors and six switches are mounted is next described in detail by referring to FIG. 16. Especially, the manner in which various resistance ratios are determined is described in detail.

In FIG. 16, the first set of resistors consists of resistors R1–R7 connected in series. One end of the resistor R7 is connected with the output of an operational amplifier 1. One end of the resistor R1 is connected with a signal-input terminal Vin. The second set of resistors consists of resistors Rx1 and Rx2. One end of the resistor Rx1 is connected with the signal-input terminal Vin, while the other end is connected with the junction of the resistors R4 and R5. One end of the resistor RX2 is connected with the input terminal Vin, whereas the other end is connected with the junction of the resistors R2 and R3. A switch SW1 is connected between the junction of the resistors R1 and R2 and the inverting input terminal of the operational amplifier 1. Similarly, other switches SW2–SW6 are connected between their respective junctions of the resistors R2–R7 and the inverting input terminal of the amplifier 1.

In this configuration, the switches SW1–SW6 are closed in turn to produce ideal gains of 50 dB, 40 dB, 30 dB, 20 dB, 10 dB and 0 dB, respectively.

Figure 17:
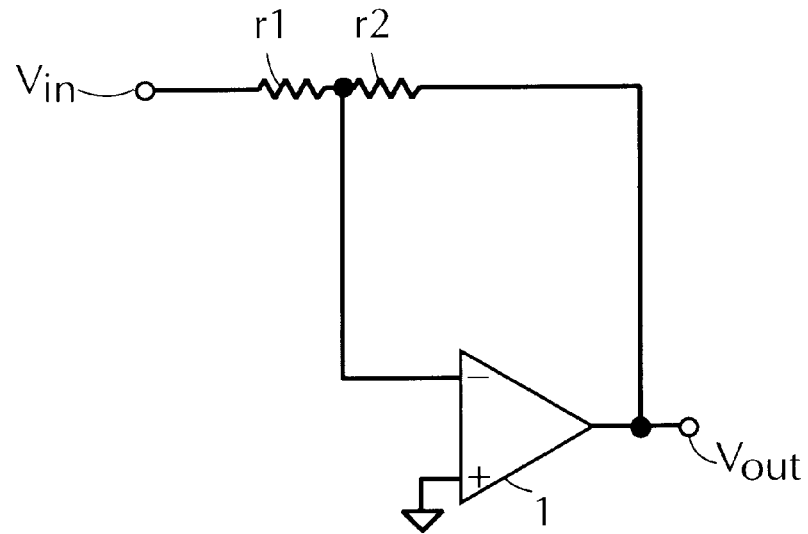
FIG. 17 is a diagram of a circuit equivalent to the circuit shown in FIG. 16.

When the switch SW4, SW5, or SW6 is closed, the circuit of FIG. 16 is equivalent to the circuit shown in FIG. 17. Similarly, when the switch SW2 or SW3 is closed, the circuit of FIG. 16 is equivalent to a circuit shown in FIG. 18. When the switch SW1 is closed, the circuit of FIG. 16 is equivalent to a circuit shown in FIG. 19.

Figure 18:
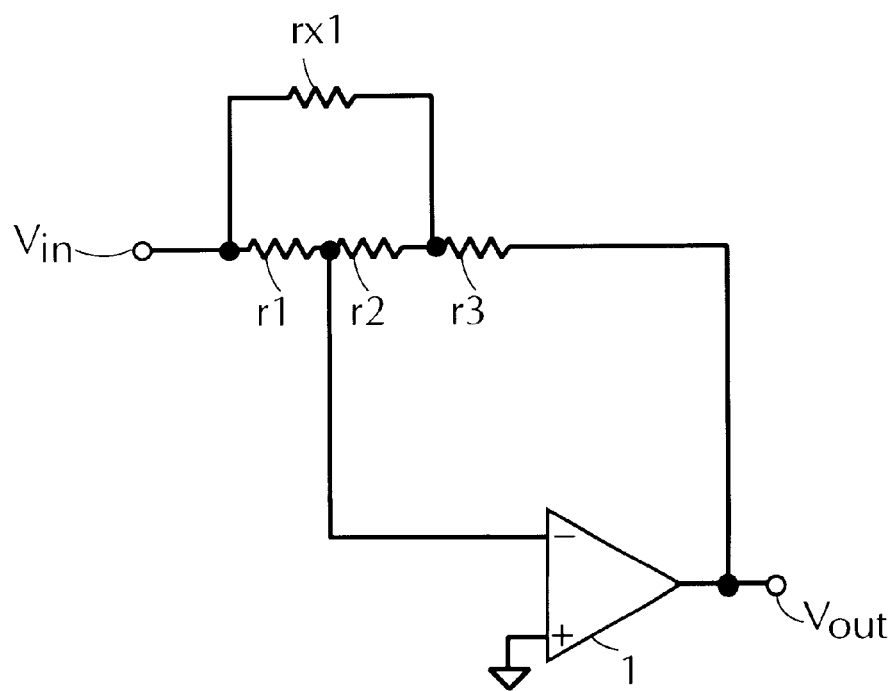
FIG. 18 is a diagram of another circuit equivalent to the circuit shown in FIG. 16.

For example, when the switch SW6 is closed, the resistor R2 of FIG. 17 is equivalent to the resistor R7 of FIG. 16, and the resistor r1 of FIG. 17 is equivalent to the composite resistor of the resistors R1–R6, Rx1 and Rx2 of FIG. 16. Similarly, when the switch SW3 is closed, the resistor r3 of FIG. 18 is equivalent to (R5+R6+R7), the resistor r2 is equivalent to R4, the resistor rx1 is equivalent to Rx1, and the resistor r1 is equivalent to the composite resistance of R1, R2, R3 and Rx2. The gain of the amplifier circuit shown in FIG. 17 is given by $$\frac{V_{out}}{V_{in}} = 20 * \text{Log}_{10}\left(\frac{r_2}{r_1}\right) \qquad (14)$$

The gain of the amplifier circuit shown in FIG. 18 is given by $$\frac{V_{out}}{V_{in}} = 20 * \text{Log}_{10} \left( \frac{r_3}{\frac{r_1 * (r_2 + r_3)}{rx1} + r_1 + r_2} \right)^{-1} \quad (15)$$

Figures 19, 20:
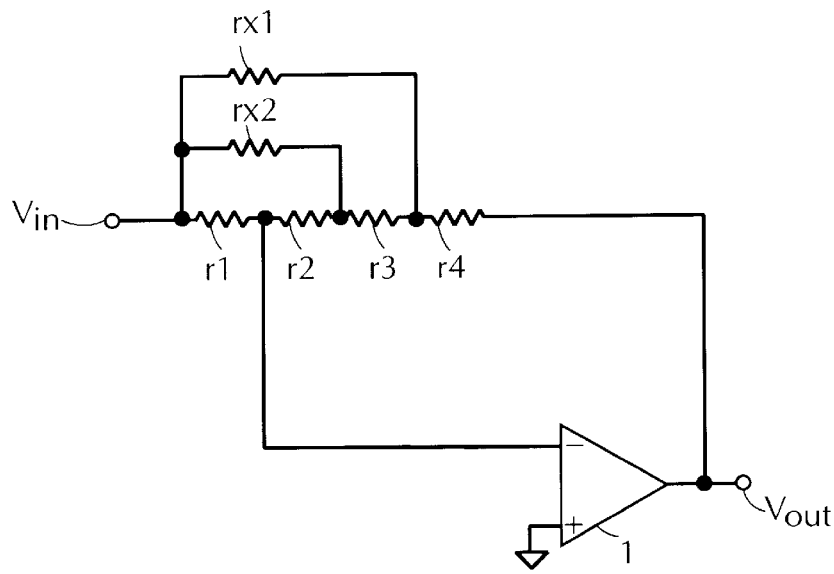
FIG. 19 is a diagram of a further circuit equivalent to the circuit shown in FIG. 16.
FIG. 20 is a table showing the resistance ratios of resistors included in the circuit shown in FIG. 16.

The gain of the amplifier circuit shown in FIG. 19 is given by $$\frac{V_{out}}{V_{in}} = \qquad (16)$$
$$20 * \text{Log}_{10} \left( \frac{r_4}{\frac{r_1 * (r_2 + r_3 + r_4)}{rx_1} + \frac{(r_1 + r_2) * (r_3 + r_4)}{rx_2} + \frac{r_1 * r_2 * (r_3 + r_4)}{rx_1 * rx_2} + r_1 + r_2 + r_3} \right)^{-1}$$

Eqs. (14)–(16), the ideal gain obtained by selectively closing the switches, and the allowance given to the ideal gain that provides amplification determine the resistance ratios of the resistors R1–R7, Rx1 and Rx2 and which of the resistors gives the minimum resistance. However, it is necessary that some of these resistors R1–R7, Rx1 and Rx2 be previously set to arbitrary values. For example, if the values of the resistors R7, (R1+R2) and (R3+R4) are previously set, the resistance ratios of the resistors R1–R7, Rx1 and Rx2 are determined. This, in turn, determines the gain having some tolerance to the ideal gain. One example of a set of resistance ratios is shown in the table of FIG. 20. In this table, the various resistance ratios are determined, assuming that the minimum resistance is 1.

Figures 21, 22:
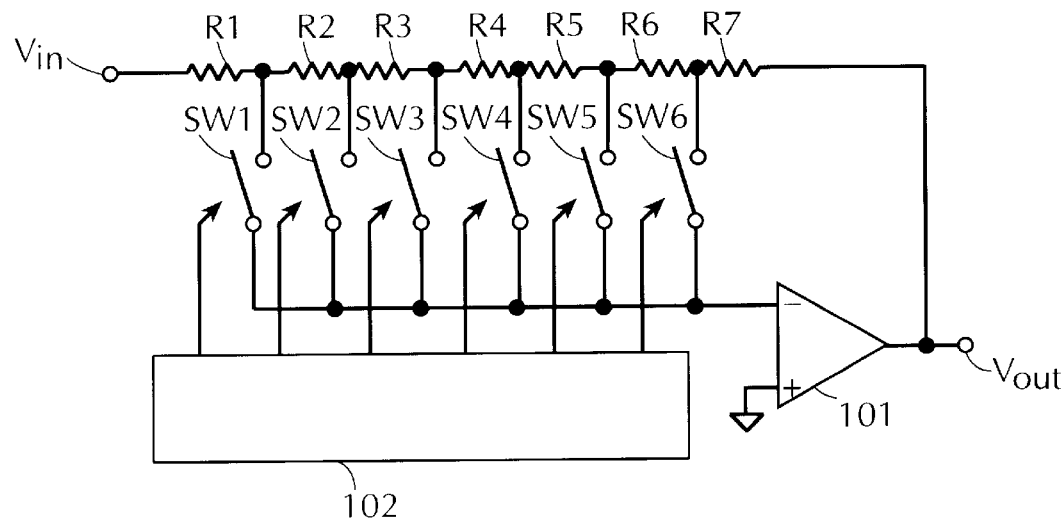
FIG. 21 is a diagram of a circuit that is equivalent to the circuit shown in FIG. 16 but fabricated by the prior art technique.
FIG. 22 is a table showing the resistance ratios of resistors included in the circuit shown in FIG. 21.

FIG. 21 shows a configuration fabricated by the prior art technique. Where the same ideal gains as the foregoing should be obtained, Eq. (5) above holds, and the resistor R1 becomes the minimum resistance. The resistance values of the various resistors are listed in the table of FIG. 22. Also, in this case, the various resistance values are determined, assuming that the minimum resistance is 1.

In this way, the total resistance required by the prior method is about 313 times as large as the minimum resistance. In contrast, in the present invention, the required total resistance is only about 31 times as large as the minimum resistance.

Figures 23, 24:
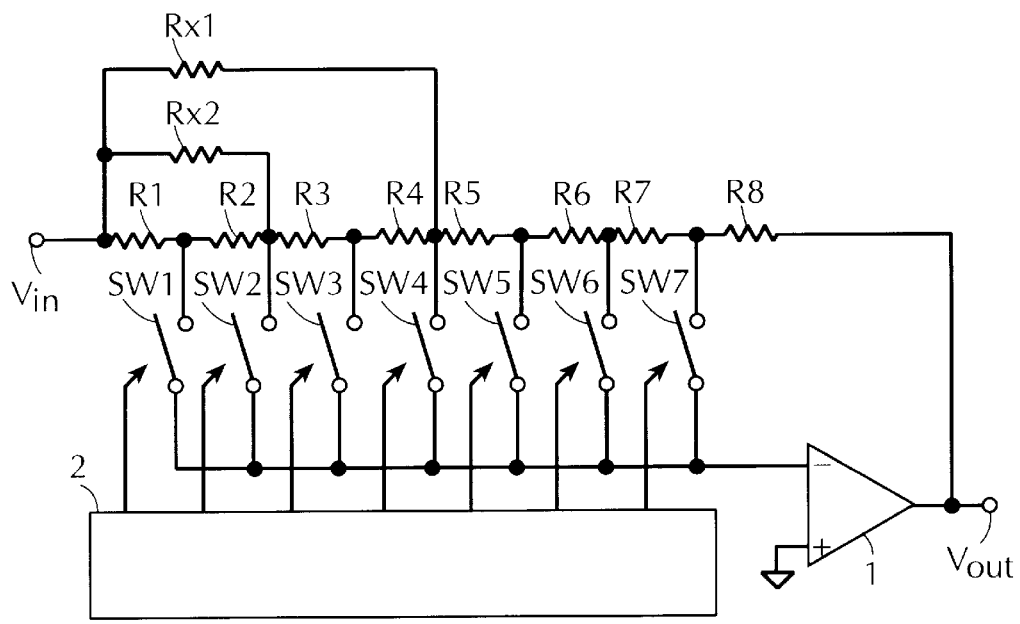
FIG. 23 is a diagram of a still further circuit in accordance with the invention.
FIG. 24 is a table showing the resistance ratios of resistors included in the circuit shown in FIG. 23.

FIG. 23 shows an example in which the first set of resistors consists of eight resistors R1–R8, the second set of resistors consists of two resistors Rx1 and Rx2 and seven switches SW1–SW7 are mounted.

Figures 25, 26:
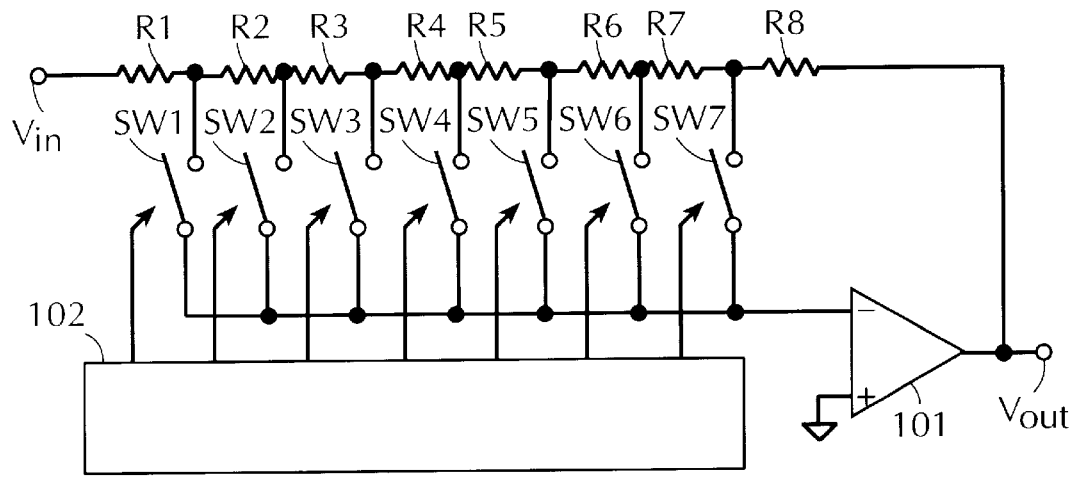
FIG. 25 is a diagram of a circuit that is equivalent to the circuit shown in FIG. 23 but fabricated by the prior art technique.
FIG. 26 is a table showing the resistance ratios of resistors included in the circuit shown in FIG. 25.

It is assumed that closing the switches SW1–SW7 of this configuration in turn produces ideal gains of 30 dB, 25 dB, 20 dB, 15 dB, 10 dB, 5 dB and 0 dB, respectively. The resistance ratios of the resistors R1–R8, Rx1 and Rx2 may be set as listed in the table of FIG. 24, for example.

Where the prior art technique is utilized, a configuration as shown in FIG. 25 is obtained. Where the same ideal gains as the foregoing should be obtained, Eq. (7) above holds, and the resistor R2 becomes the minimum resistance. The various resistors assume resistance values as listed in the table of FIG. 26. Also, in this case, the resistance ratios of the various resistors are determined, assuming that the minimum resistance is 1.

Figure 27:
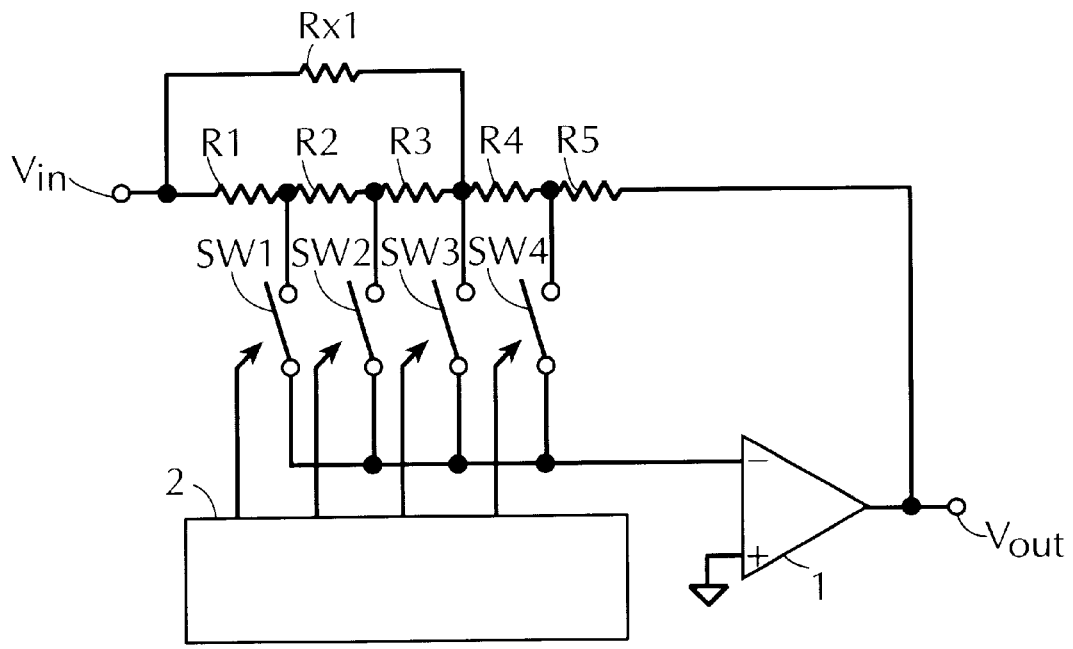
FIG. 27 is a diagram of an additional circuit in accordance with the invention.
Figure 28:
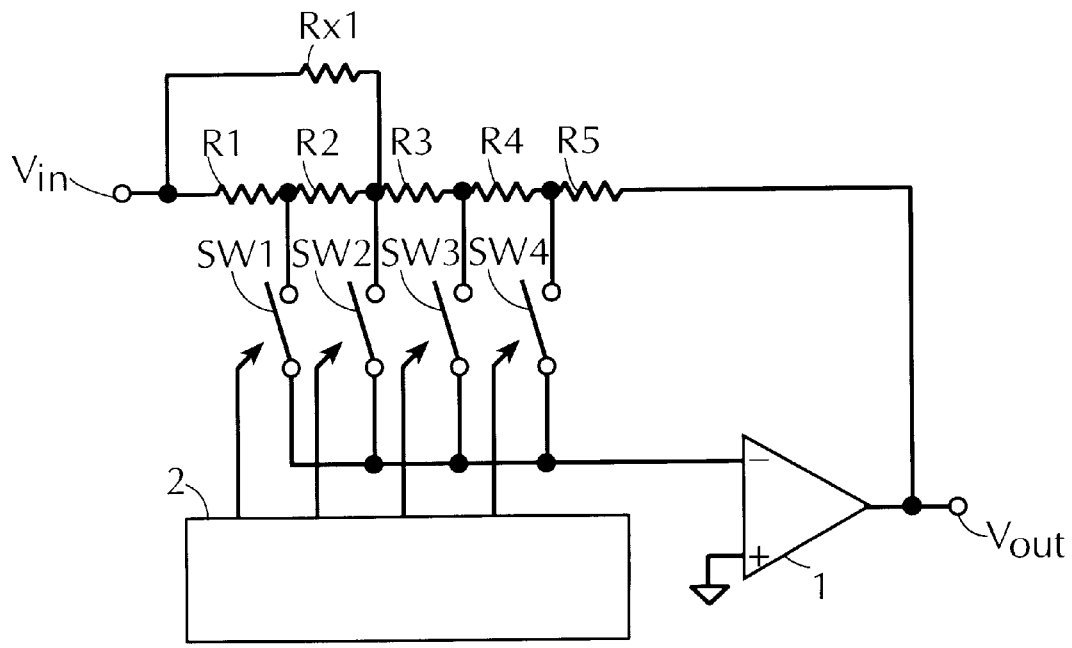
FIG. 28 is a diagram of a yet further circuit in accordance with the invention.

FIGS. 27 and 28 show examples in which the first set of resistors consists of five resistors R1–R5, the second set of resistors consists of one resistor Rx1, and four switches SW1–SW4 are mounted.

Figures 29A, 29B, 30:
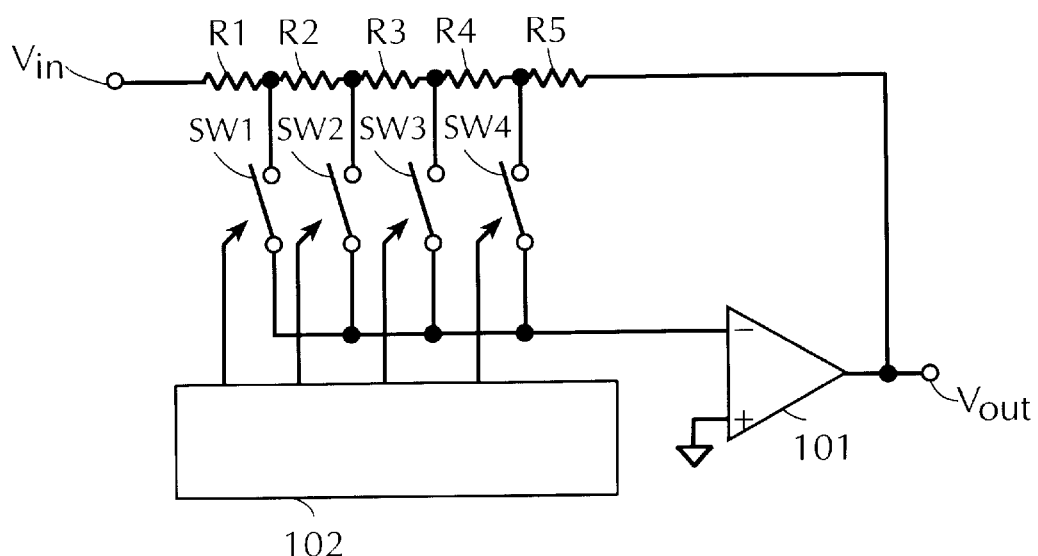
FIGS. 29A and 29B are tables showing the resistance ratios of resistors included in the circuits shown in FIGS. 27 and 28, respectively.
FIG. 30 is a diagram of a circuit that is equivalent to the circuits shown in FIGS. 27 and 28 but fabricated by the prior art technique.

It is assumed that closing the switches SW1–SW4 of this configuration in turn produces ideal gains of 40 dB, 25 dB, 20 dB and 0 dB, respectively. The resistance ratios of the resistors R1–R5 and Rx1 may be set as listed in the tables of FIGS. 29(a) and 29(b), which correspond to FIGS. 27 and 28, respectively.

Where the prior art technique is utilized, a configuration as shown in FIG. 30 is obtained. Where the same ideal gains as the foregoing should be obtained, the resistance values of the various resistors are set as listed in the table of FIG. 31.

Also, in this case, the resistance ratios of the various resistors are determined, assuming that the minimum resistance is 1.

Figures 31, 32:
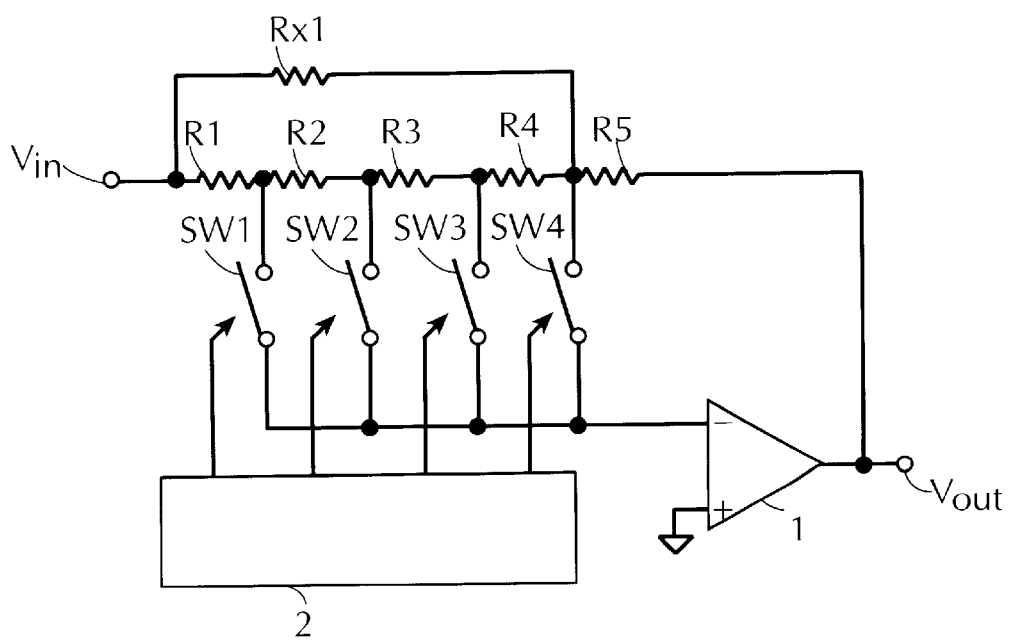
FIG. 31 is a table showing the resistance ratios of resistors included in the circuit shown in FIG. 30.
FIG. 32 is a diagram of another circuit in accordance with the invention.
Figures 33, 34A, 34B:
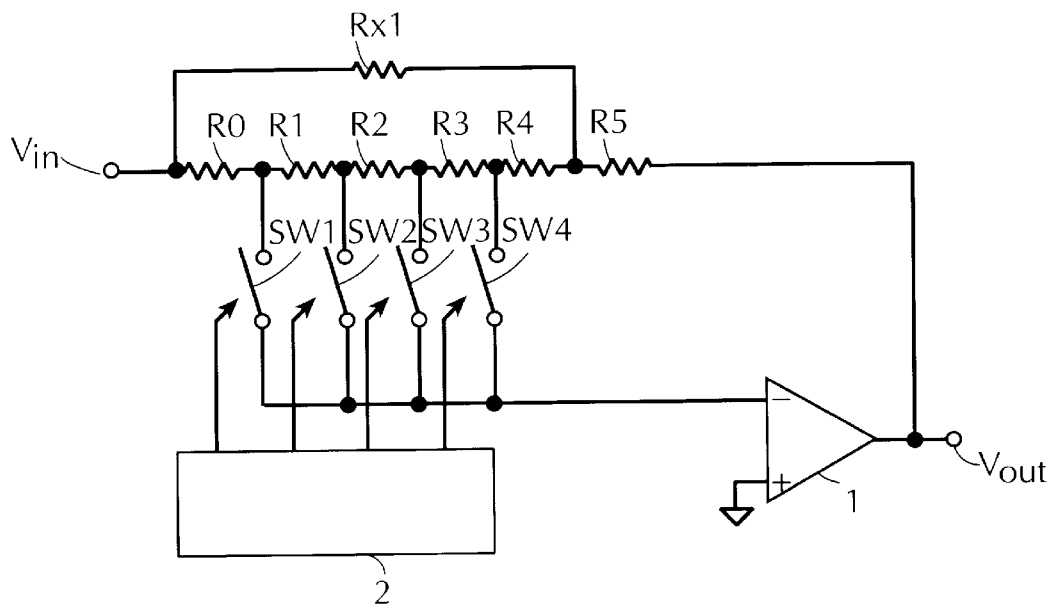
FIG. 33 is a diagram of another circuit in accordance with the invention.
FIGS. 34A and 34B are tables showing the resistance ratios of resistors included in the circuits shown in FIGS. 32 and 33, respectively.
Figures 35, 36:
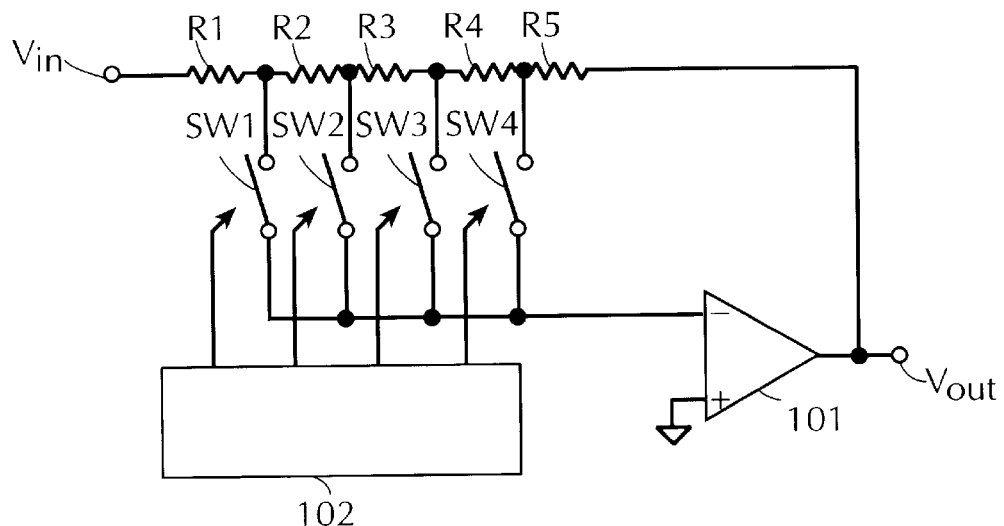
FIG. 35 is a diagram of a circuit that is equivalent to the circuits shown in FIGS. 32 and 33 but fabricated by the prior art technique.
FIG. 36 is a table showing the resistance ratios of resistors included in the circuit shown in FIG. 35.

It is assumed that closing the switches SW1–SW4 of the configurations of FIGS. 32 and 33 in turn produces ideal gains of 32 dB, 26 dB, 22 dB and 20 dB, respectively. The resistance ratios of the various resistors may be set as listed in the tables of FIGS. 34(a) and 34(b), which correspond to FIGS. 32 and 33, respectively. FIG. 33 shows a specific example of the circuit shown in FIG. 2, and in which one end of each of resistors of the second set is connected to junctions of the resistors between the resistors that are connected with no switch.

Where the prior art technique is utilized, a configuration as shown in FIG. 35 is obtained. Where the same ideal gains as the foregoing should be obtained, the resistance values of the various resistors are set as listed in the table of FIG. 36. Also, in this case, the resistance ratios of the various resistors are determined, assuming that the minimum resistance is 1.

Figure 37:
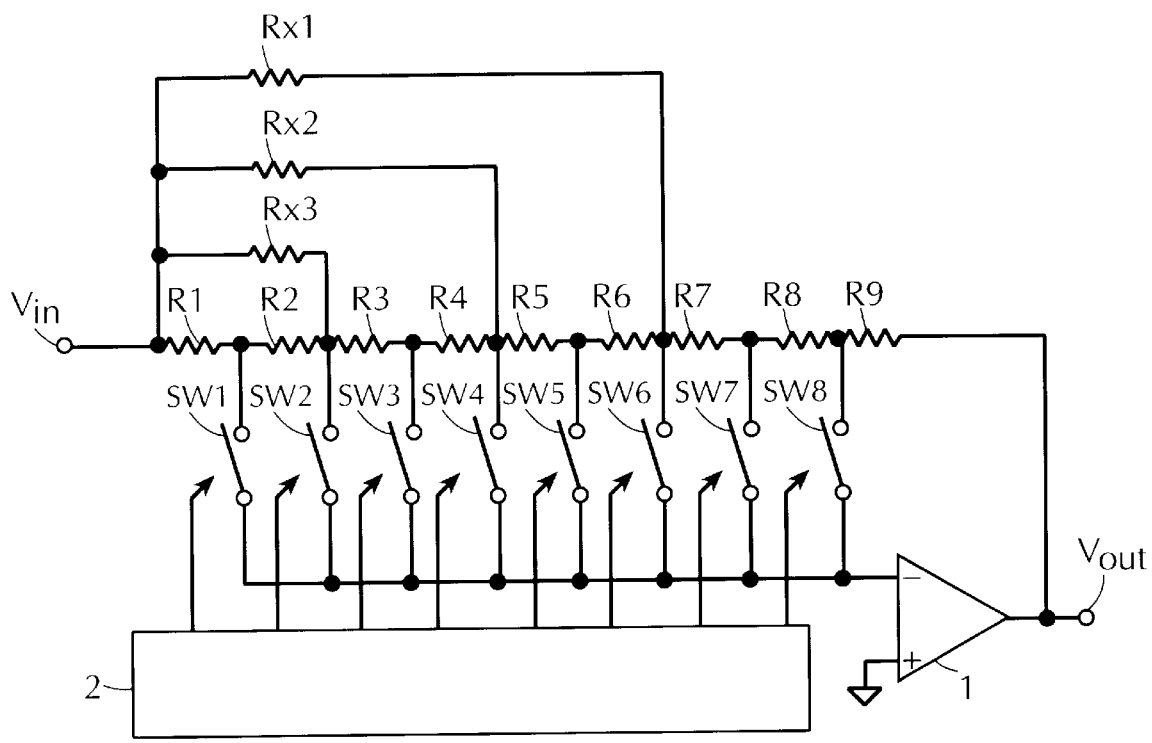
FIG. 37 is a diagram of another circuit in accordance with the invention.
Figures 39, 40:
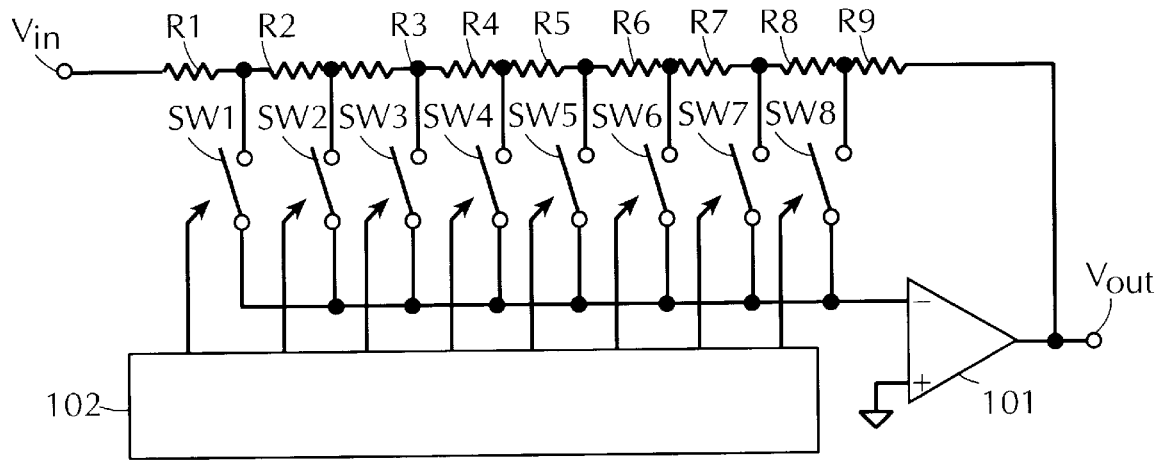
FIG. 39 is a diagram of a circuit that is equivalent to the circuit shown in FIG. 38 but fabricated by the prior art technique.
FIG. 40 is a table showing the resistance ratios of resistors included the circuit shown in FIG. 39.

It is assumed that closing the switches SW1–SW8 of the configuration shown in FIG. 37 in turn produces ideal gains of 70 dB, 60 dB, 50 dB, 40 dB, 30 dB, 20 dB, 10 dB and 0 dB, respectively. The resistance ratios of the resistors may be set as listed in the table of FIG. 38, for example.

Where the prior art technique is utilized, a configuration as shown in FIG. 39 is obtained. Where the same ideal gains as the foregoing should be obtained, the resistance values of the various resistors are set as listed in the table of FIG. 40. Also, in this case, the resistance ratios of the various resistors are determined, assuming that the minimum resistance is 1.

In this way, the ratio of the total resistance to the minimum resistance can be made smaller than heretofore. Therefore, where a resistor is fabricated from a semiconductor resistive element whose minimum resistor size is limited, the area of the resistor portion can be made small. Where the same area as used conventionally is used, greater gain providing amplification is obtained.

In the above examples, the first set of resistors consists of 3 to 9 resistors, and the second set of resistors consists of 1 to 3 resistors. Some combinations of them are used in the descriptions of the above examples.

It is to be noted that the foregoing examples merely constitutes exemplary embodiments of the present invention. In FIG. 1, the number of resistors of the first set (n+1) and the number of switches n are determined according to the required number of steps. The number of resistors of the second set m can be increased up to n−2. The positions of their junctions can be set at will between the junction of the resistors R2 and R3 and the junction of the resistors Rn and Rn+1.

The obtained gain of the circuit shown in FIG. 1 can be expressed in terms of the above equations using the values of the various resistors, irrespective of the design of the circuit. The resistors can be set to appropriate values according to these equations.

We have derived a general formula (using n and m) expressing the relation of each resistance value to the gain of the configuration shown in FIG. 1. Since this general formula has an exorbitant number of items and can never be presented in this specification, this formula is omitted herein.

In the circuit shown in FIG. 2, the number of resistors, the junctions, and the various resistance values can be appropriately set. Examples of the variable-gain amplifier circuit have been presented thus far. Examples of a variable-gain attenuator circuit are given below.

Figure 41:
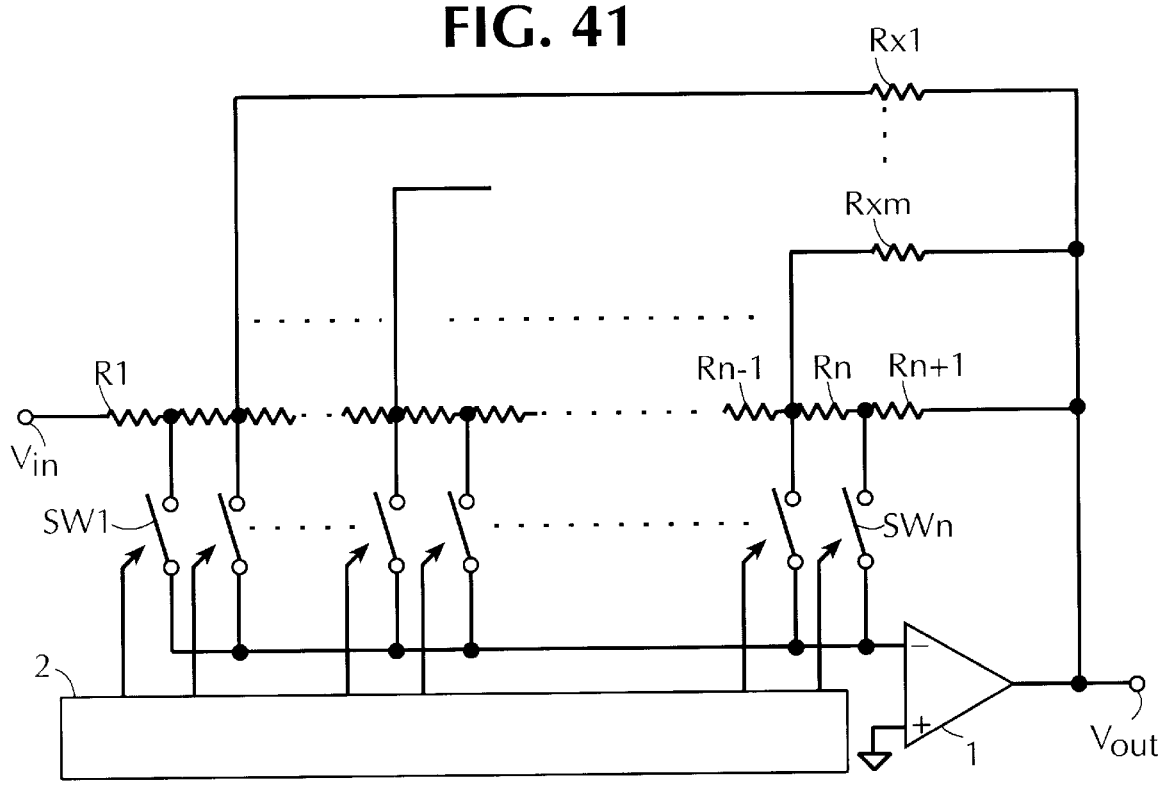
FIG. 41 is a diagram of another circuit in accordance with the invention.
Figure 42:
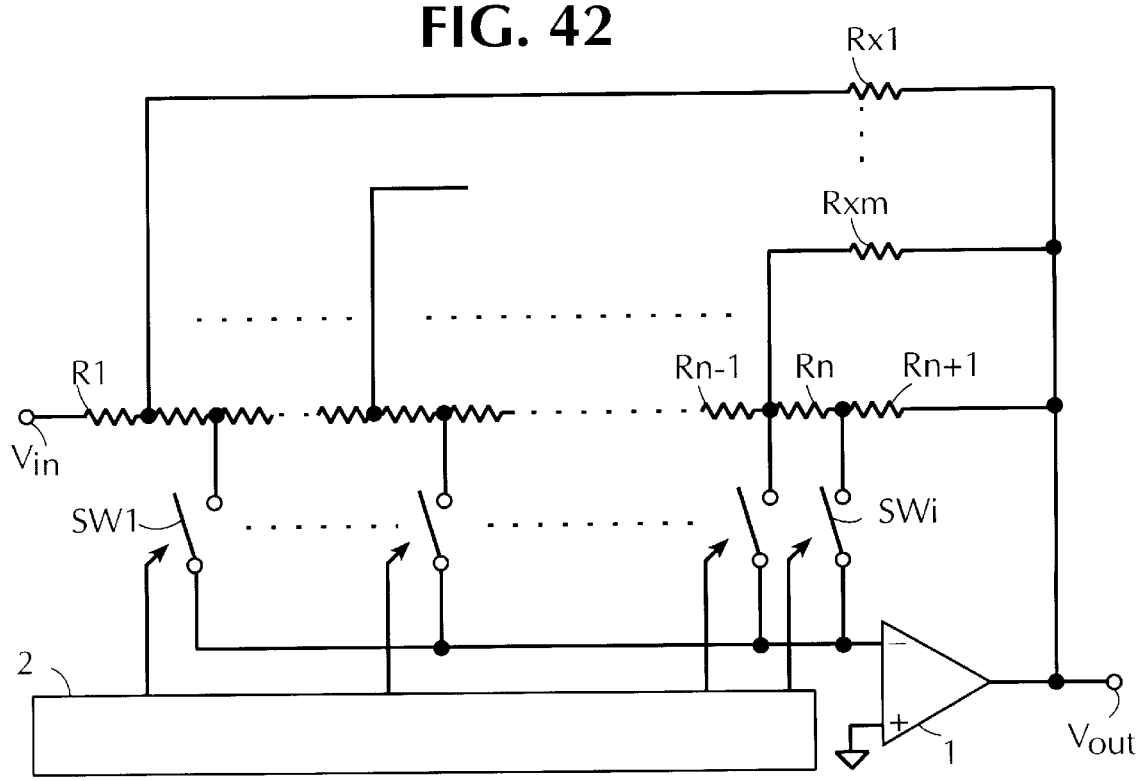
FIG. 42 is a diagram of another circuit in accordance with the invention.

FIGS. 41 and 42 show examples of a variable-gain attenuator circuit in accordance with the invention. In the variable-gain amplifier circuit described above, one end of each of the resistors Rx1–Rxm of the second set is connected with the signal-input terminal Vin. In contrast, in the variable-gain attenuator circuits shown in FIGS. 41 and 42, one end of each of the resistors is connected with the output of the operational amplifier 1. These attenuator circuits shown in FIGS. 41 and 42 are similar to the above-described variable-gain amplifier circuit in other respects.

Figures 45, 46:
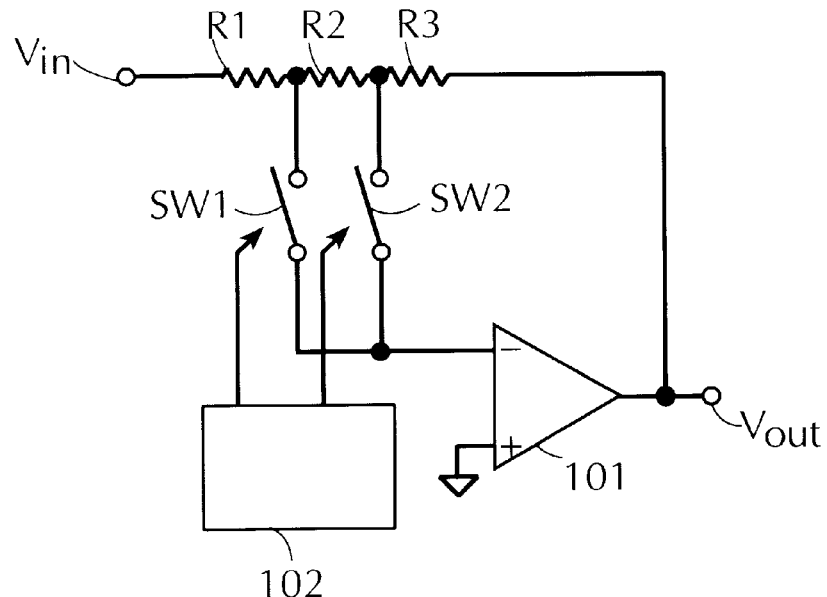
FIG. 45 is a diagram of a circuit that is equivalent to the circuit shown in FIG. 43 but fabricated by the prior art technique.
FIG. 46 is a table showing the resistance ratios of resistors included in the circuit shown in FIG. 45.

First, a specific example of the circuit shown in FIG. 41 is described. It is assumed that ideal gains of 20 dB and 25 dB are obtained by closing switches SW1 and SW2 of an amplifier circuit shown in FIG. 43. The resistance ratios of these resistors may be set, for example, as listed in the tables of FIGS. 44(a) and 44(b) for these gains, respectively.

Where the prior art technique is utilized, a configuration as shown in FIG. 45 is obtained. Where the same ideal gains as the foregoing should be obtained, the resistance values of the various resistors are set as listed in the table of FIG. 46. Also, in this case, the resistance ratios of the various resistors are determined, assuming that the minimum resistance is 1.

Figures 43, 44A, 44B:
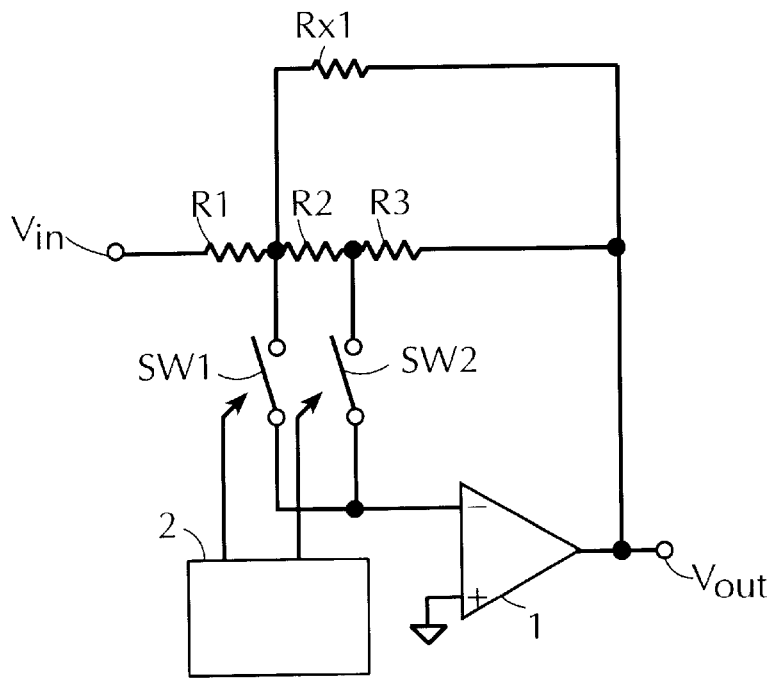
FIG. 43 is a diagram of one example of the circuit shown in FIG. 1.
FIGS. 44A and 44B are tables showing the resistance ratios of resistors included in the circuit shown in FIG. 43.

It is assumed that closing the switches SW1 and SW2 of the configuration shown in FIG. 43 in turn produces ideal gains of −40 dB and −60 dB, respectively. The resistance ratios of the resistors may be set as listed in the tables of FIGS. 47(a) and 47(b) for these gains, respectively.

Where the same ideal gains as the foregoing should be obtained with the conventional structure shown in FIG. 45, the various resistors assumed resistance values as listed in the table of FIG. 48. Also, in this case, the resistance ratios of the various resistors are determined, assuming that the minimum resistance is 1.

Figure 49:
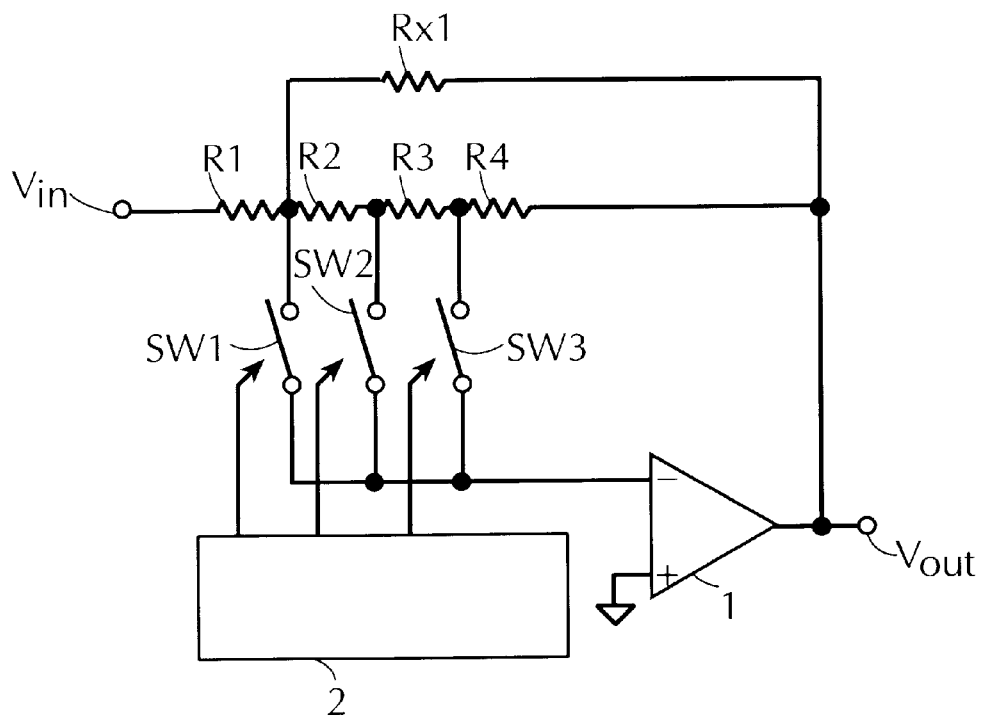
FIG. 49 is a diagram of another circuit in accordance with the invention.
Figure 50:
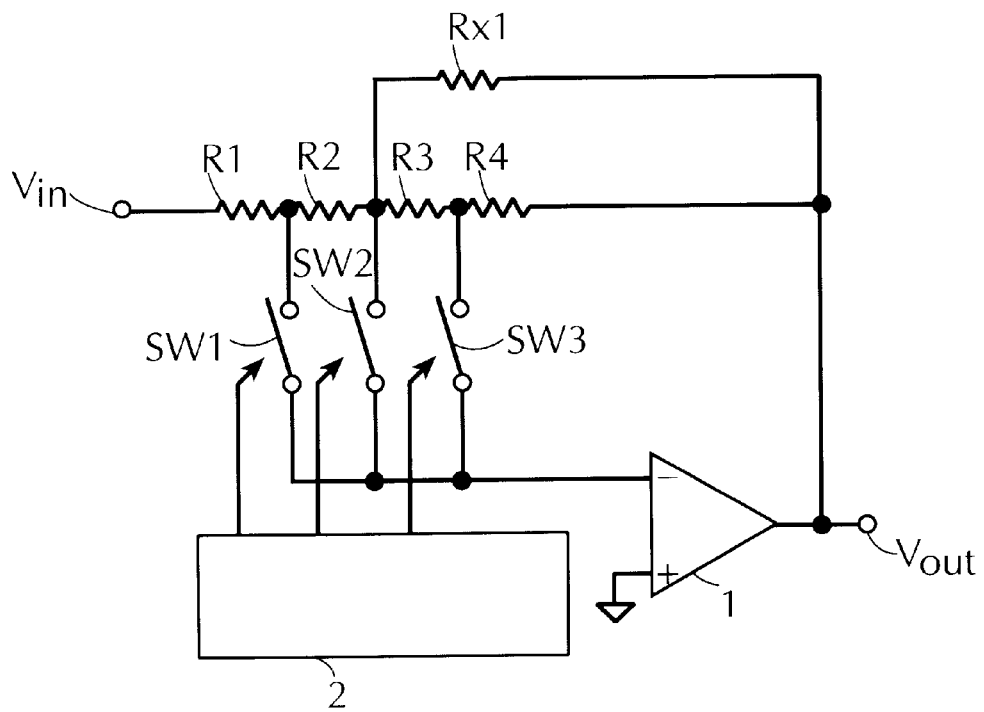
FIG. 50 is a diagram of another circuit in accordance with the invention.
Figures 51A, 51B, 52:
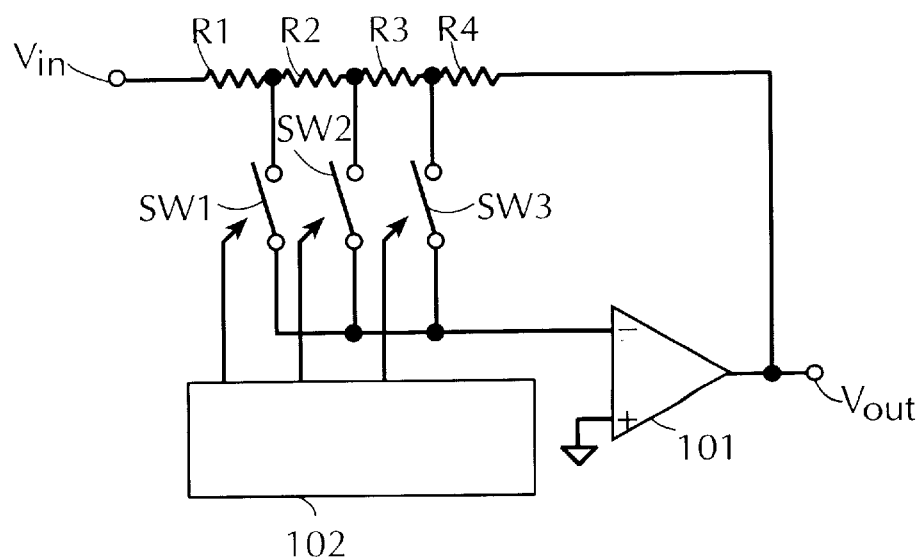
FIGS. 51A and 51B are tables showing the resistance ratios of resistors included in the circuits shown in FIGS. 49 and 50, respectively.
FIG. 52 is a diagram of a circuit that is equivalent to the circuits shown in FIGS. 49 and 50 but fabricated by the prior art technique.

It is assumed that closing the switches SW1–SW3 of the configurations shown in FIGS. 49 and 50 in turn produces ideal gains of −30 dB, −35 dB and −40 dB, respectively. The resistance ratios of the resistors may be set as listed in the tables of FIGS. 51(a) and 51(b) for these gains, respectively. FIGS. 51(a) and 51(b) correspondto FIGS. 49 and 50, respectively.

Where the prior art technique is utilized, a configuration as shown in FIG. 52 is obtained. Where the same ideal gains as the foregoing should be obtained, the resistance values of the various resistors are set as listed in the table of FIG. 53. Also, in this case, the resistance ratios of the various resistors are determined, assuming that the minimum resistance is 1.

It is assumed that closing the switches SW1–SW3 of the configurations shown in FIGS. 49 and 50 in turn produces ideal gains of 0 dB, −20 dB and −40 dB, respectively. The resistance ratios of the resistors may be set as listed in the tables of FIGS. 54(a) and 54(b) for these gains, respectively. FIGS. 54(a) and 54(b) correspond to FIGS. 49 and 50, respectively.

Where the prior art technique is utilized, a configuration as shown in FIG. 52 is obtained. Where the same ideal gains as the foregoing should be obtained, the resistance values of the various resistors are set as listed in the table of FIG. 55. Also, in this case, the resistance ratios of the various resistors are determined, assuming that the minimum resistance is 1.

Figures 55, 56:
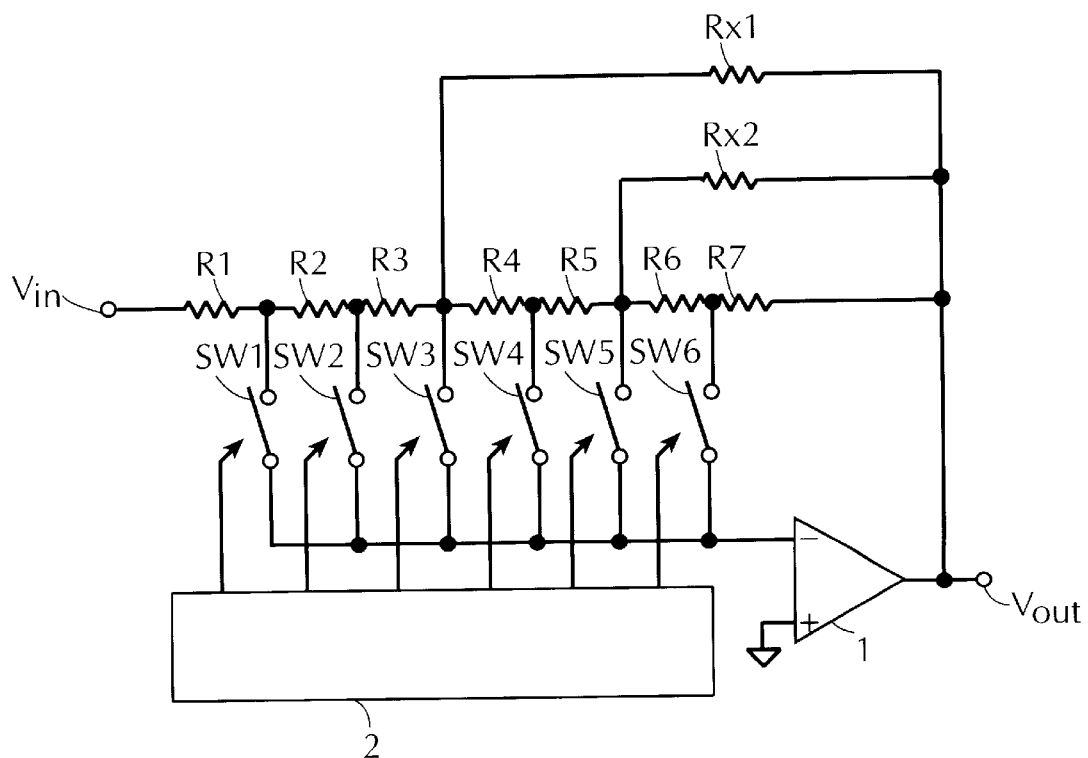
FIG. 55 is a table showing the resistance ratios of resistors included in the circuit shown in FIG. 52.
FIG. 56 is a diagram of another circuit in accordance with the invention.

An example of using seven resistors as the first set of resistor and mounting six switches is described in further detail by referring to FIG. 56. Especially, the manner in which the various resistance ratios are determined is described in greater detail.

In FIG. 56, the first set of resistors consists of resistors R1–R7 connected in series. One end of the resistor R7 is connected with the output of an operational amplifier 1. One end of the resistor R1 is connected with a signal-input terminal Vin. The second set of resistors consists of Rx1 and Rx2. One end of the resistor Rx1 is connected with the output of the amplifier 1, while the other end is connected with the junction of the resistors R3 and R4. One end of the resistor Rx2 is connected with the output of the amplifier 1, whereas the other end is connected with the junction of the resistors R5 and R6. A switch SW1 is connected between the junction of the resistors R1 and R2 and the inverting input terminal of the operational amplifier 1. Similarly, other switches SW2–SW6 are connected between their respective junctions of the resistors R2–R7 and the inverting input terminal of the amplifier 1.

It is assumed that closing the switches SW1–SW6 of this configuration in turn produces ideal gains of 0 dB, −10 dB, −20 dB, −30 dB, −40 dB and −50 dB, respectively.

Figure 57:
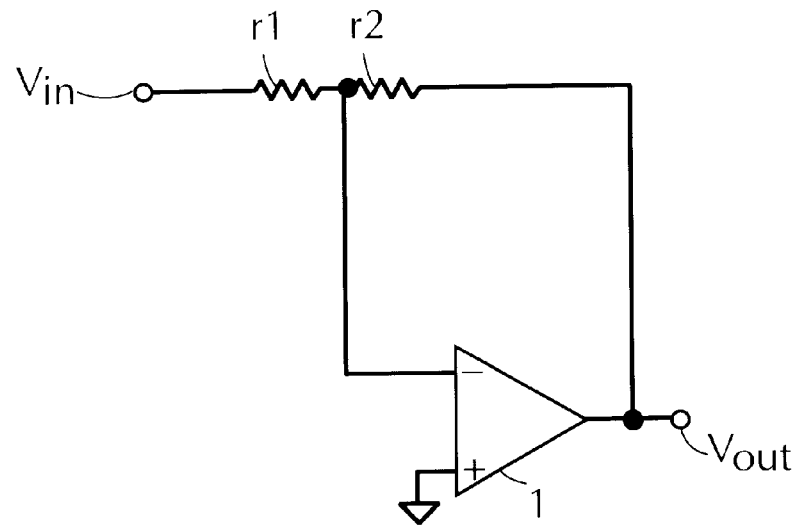
FIG. 57 is a diagram of a circuit equivalent to the circuit shown in FIG. 56.

When the switch SW1, SW2, or SW3 is closed, the circuit of FIG. 56 is equivalent to a circuit shown in FIG. 57. Similarly, when the switch SW4 or SW5 is closed, the circuit of FIG. 56 is equivalent to a circuit shown in FIG. 58. When the switch SW6 is closed, the circuit of FIG. 56 is equivalent to a circuit shown in FIG. 59.

Figure 58:
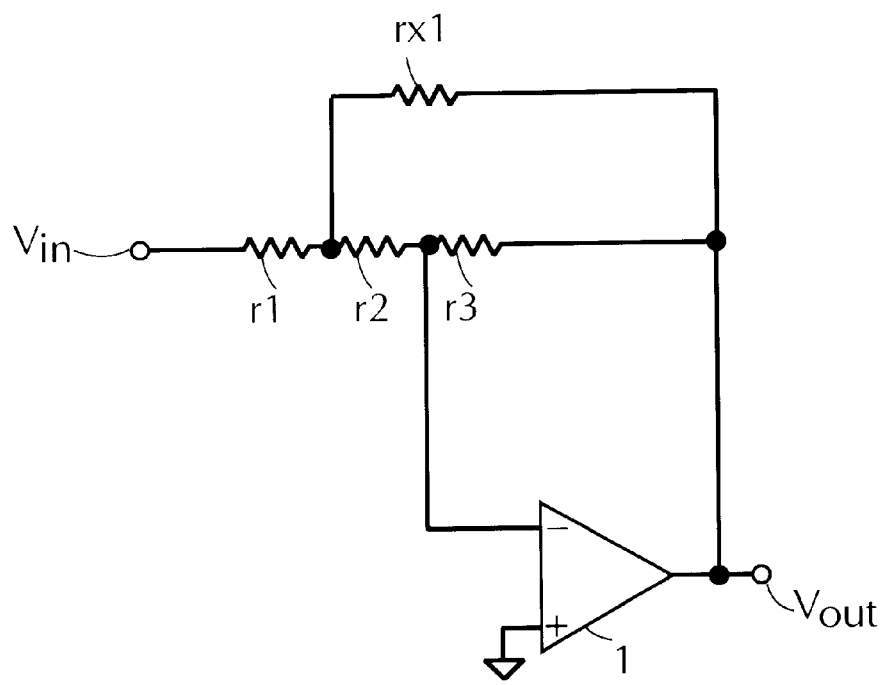
FIG. 58 is a diagram of another circuit equivalent to the circuit shown in FIG. 56.

For example, when the switch SW1 is closed, the resistor R1 of FIG. 57 is equivalent to the resistor R1 of FIG. 56, and the resistor r2 of FIG. 57 is equivalent to the composite resistor of the resistors R2–R7, Rx1 and Rx2 of FIG. 56. Similarly, when the switch SW4 is closed, the resistor r1 of FIG. 58 is equivalent to (R1+R2+R3), the resistor r2 is equivalent to R4, the resistor rxl is equivalent to Rx1, and the resistor r3 is equivalent to the composite resistor of R5, R6, R7 and Rx2. The gain of the circuit shown in FIG. 57 is given by $$\frac{V_{out}}{V_{in}} = 20 * \text{Log}_{10}\left(\frac{r_2}{r_1}\right) \quad (17)$$

The gain of the circuit shown in FIG. 58 is given by $$\frac{V_{out}}{V_{in}} = 20 * \text{Log}_{10}\left(\frac{r_3}{\frac{r_1 * (r_2 + r_3)}{rxl} + r_1 + r_2}\right) \quad (18)$$

Figures 59, 60:
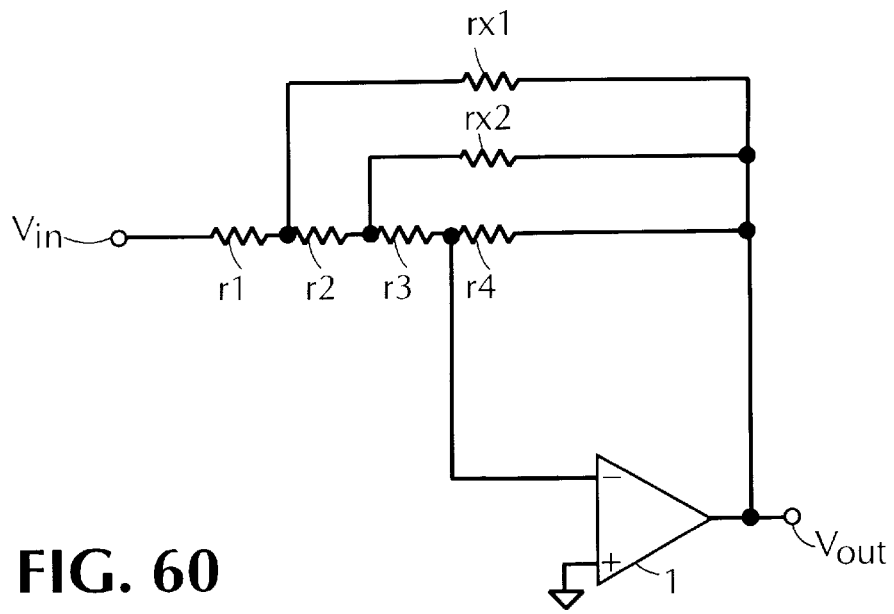
FIG. 59 is a diagram of a further circuit equivalent to the circuit shown in FIG. 56.
FIG. 60 is a table showing the resistance ratios of resistors included in the circuit shown in FIG. 56.

The gain of the amplified circuit shown in FIG. 59 is given by $$\frac{V_{out}}{V_{in}} = \qquad (19)$$

$$20 * \text{Log}_{10} \left( \frac{r_4}{\frac{r_1 * (r_2 + r_3 + r_4)}{rx_1} + \frac{(r_1 + r_2) * (r_3 + r_4)}{rx_2} + \frac{r_1 * r_2 * (r_3 + r_4)}{rx_1 * rx_2} + r_1 + r_2 + r_3} \right)$$

Figures 61, 62:
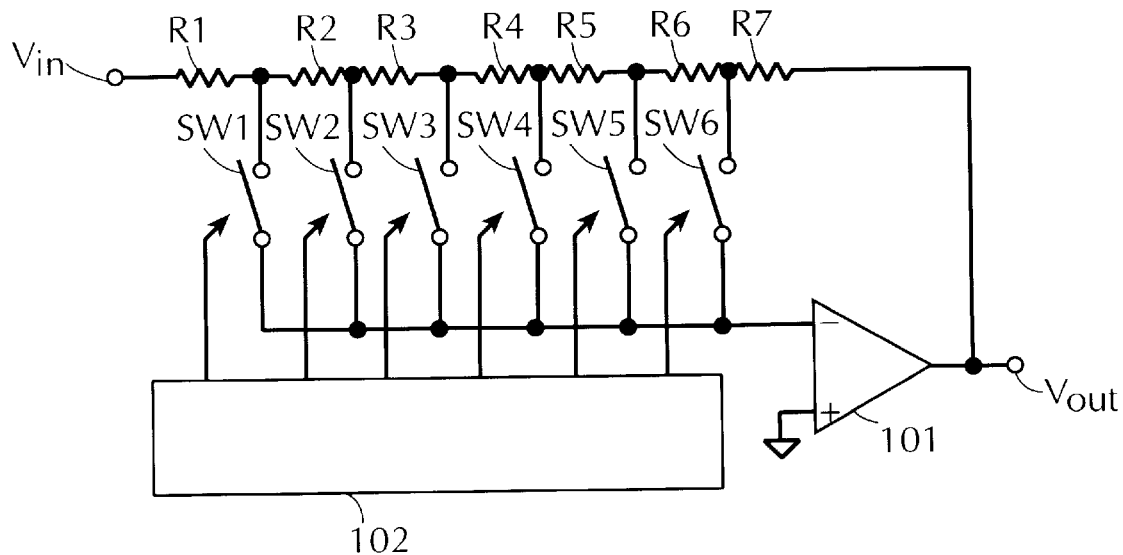
FIG. 61 is a diagram of a circuit that is equivalent to the circuit shown in FIG. 56 but fabricated by the prior art technique.
FIG. 62 is a table showing the resistance ratios of resistors included in the circuit shown in FIG. 61.

Eqs. (17)–(19), the ideal gain obtained by selectively closing the switches, and the allowance given to the ideal gain that provides attenuation determine the resistance ratios of the resistors R1–R7, Rx1 and Rx2 and which of resistors becomes the minimum resistance. However, it is necessary that some of these resistors R1–R7, Rx1 and Rx2 be previously set to any values. For example, if the values of the resistors R1, (R4+R5) and (R6+R7) are previously set, the resistance ratios of the resistors R1–R7, Rx1 and Rx2 are determined. This, in turn, determines the ideal gain to some tolerance. One example of a set of resistance ratios is shown in the table of FIG. 60. In this table, the various resistance ratios are determined, assuming that the minimum resistance is 1.

Where the prior art technique is utilized, a configuration as shown in FIG. 61 is obtained. Where the same ideal gains as the foregoing should be obtained, the resistance values of the various resistors are set as listed in the table of FIG. 62. Also, in this case, the resistance ratios of the various resistors are determined, assuming that the minimum resistance is 1.

In this embodiment, the total resistance required by the prior method is about only 31 times as large as the minimum resistance. In contrast, in the prior art method, the required total resistance is about 313 times as large as the minimum resistance.

Figures 63, 64:
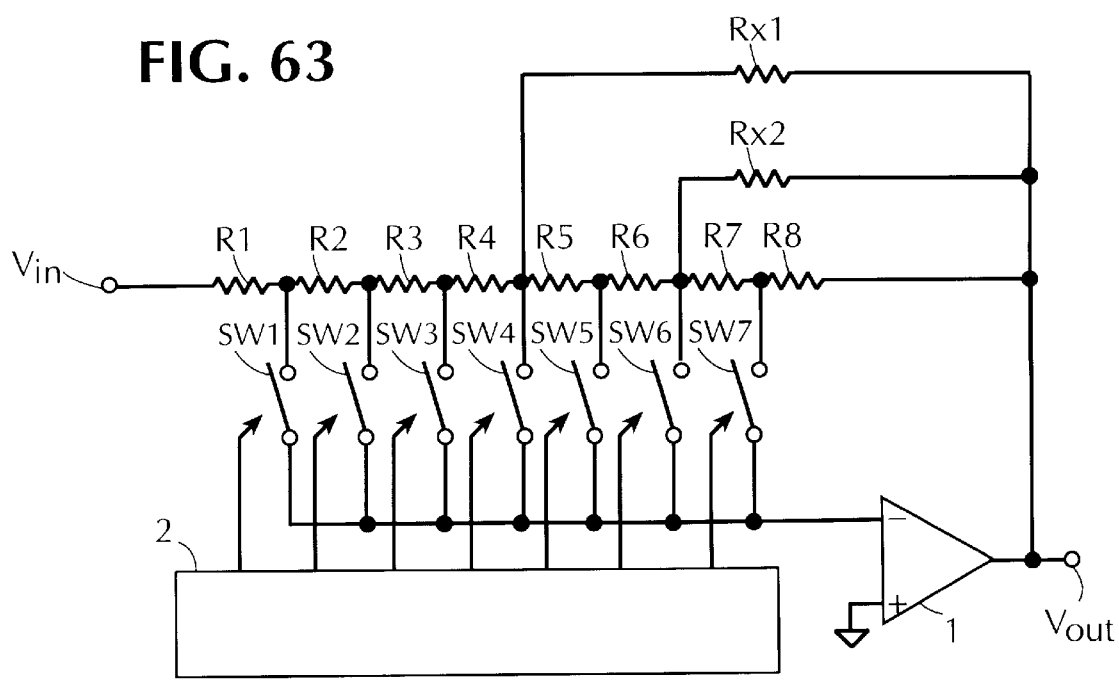
FIG. 63 is a diagram of another circuit in accordance with the invention.
FIG. 64 is a table showing the resistance ratios of resistors included in the circuit shown in FIG. 63.
Figures 65, 66:
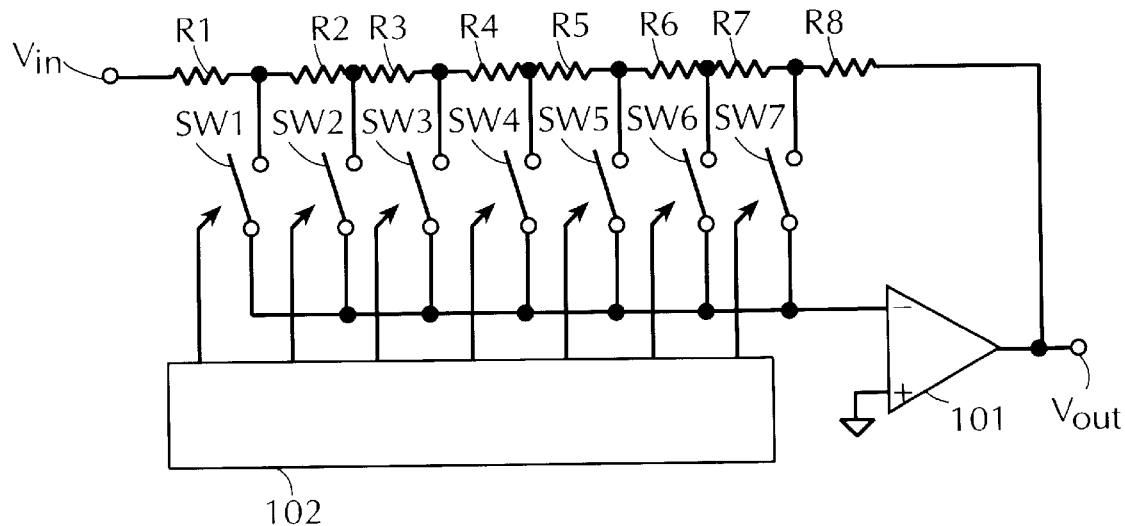
FIG. 65 is a diagram of a circuit that is equivalent to the circuit shown in FIG. 63 but fabricated by the prior art technique.
FIG. 66 is a table showing the resistance ratios of resistors included in the circuit shown in FIG. 65.

It is assumed that closing the switches SW1–SW7 of the configuration shown in FIG. 63 in turn produces ideal gains of 0 dB, –5 dB, –10 dB, –15 dB, –20 dB, –25 dB and –30 dB, respectively. The resistance ratios of the resistors R1–R8, Rx1 and Rx2 may be set as given in the table of FIG. 64.

Where the prior art technique is utilized, a configuration as shown in FIG. 65 is obtained. Where the same ideal gains as the foregoing should be obtained, the various resistors assume resistance values as listed in the table of FIG. 66. Also, in this case, the resistance ratios of the various resistors are determined, assuming that the minimum resistance is 1.

Figure 67:
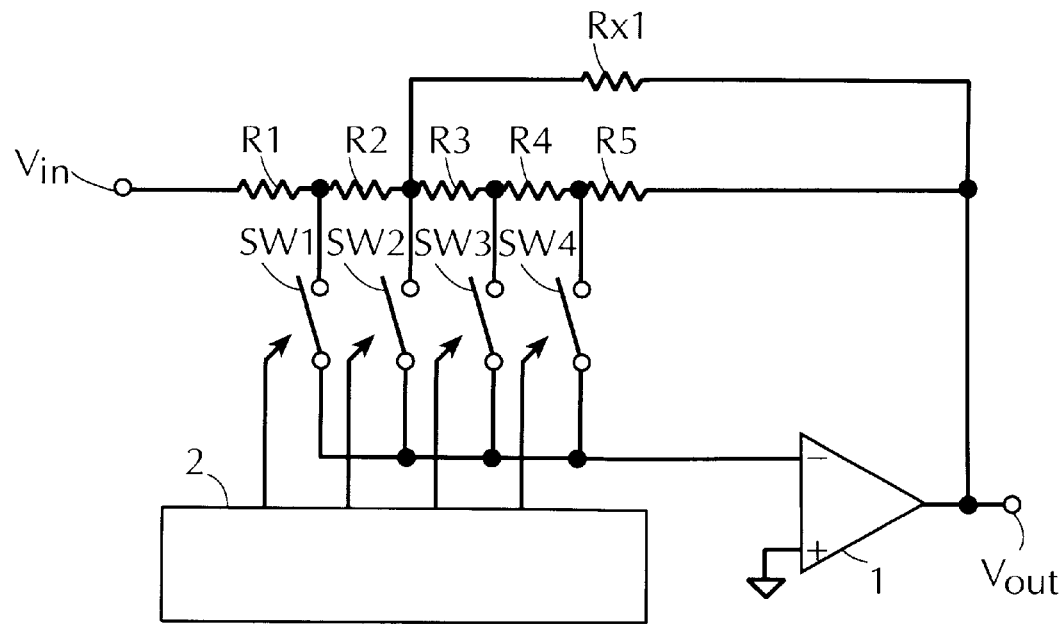
FIG. 67 is a diagram of another circuit in accordance with the invention.
Figure 68:
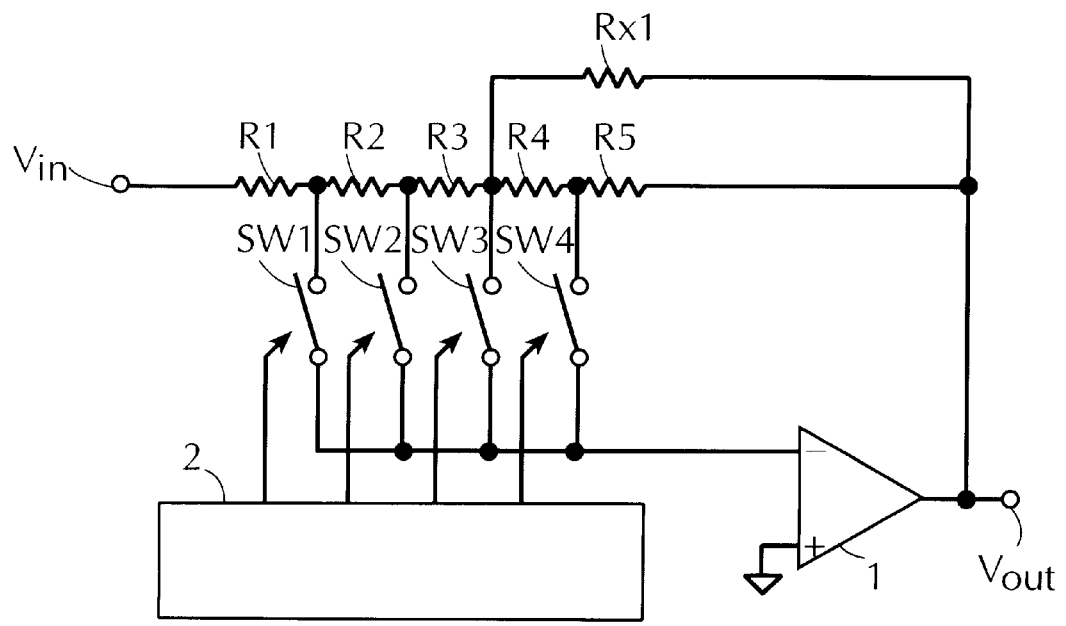
FIG. 68 is a diagram of another circuit in accordance with the invention.
Figures 69A, 69B, 70:
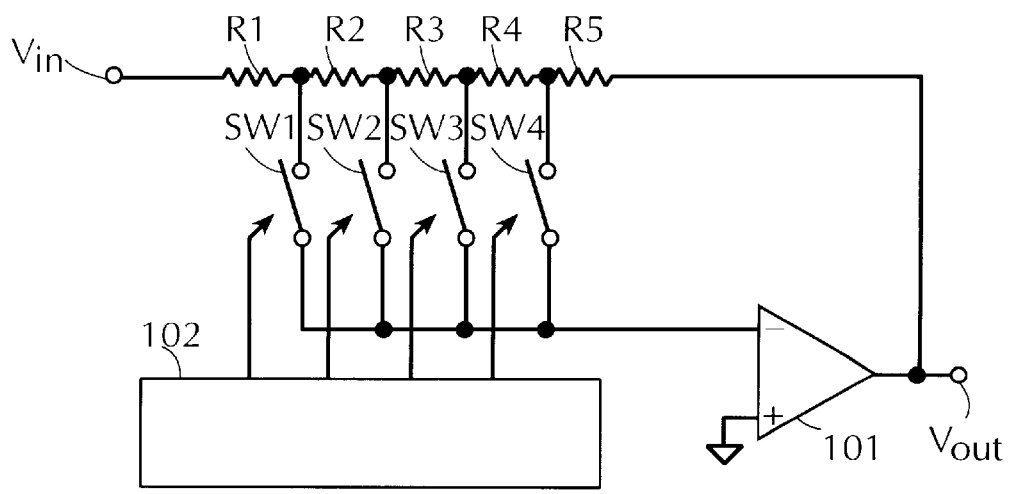
FIGS. 69A and 69B are tables showing the resistance ratios of resistors included in the circuits shown in FIGS. 67 and 68, respectively.
FIG. 70 is a diagram of a circuit that is equivalent to the circuits shown in FIGS. 67 and 68 but fabricated by the prior art technique.

It is assumed that closing the switches SW1–SW4 of the configurations shown in FIGS. 67 and 68 in turn produces ideal gains of 0 dB, –20 dB, –25 dB and –40 dB, respectively. The resistance ratios of the resistors R1–R5 and Rx1 may be set as listed in the tables of FIGS. 69(*a*) and 69(*b*) for these gains, respectively. FIGS. 69(*a*) and 69(*b*) correspond to FIGS. 67 and 68, respectively.

Where the prior art technique is utilized, a configuration as shown in FIG. 70 is obtained. Where the same ideal gains as the foregoing should be obtained, the various resistors assume resistance values as listed in the table of FIG. 71. Also, in this case, the resistance ratios of the various resistors are determined, assuming that the minimum resistance is 1.

Figures 71, 72:
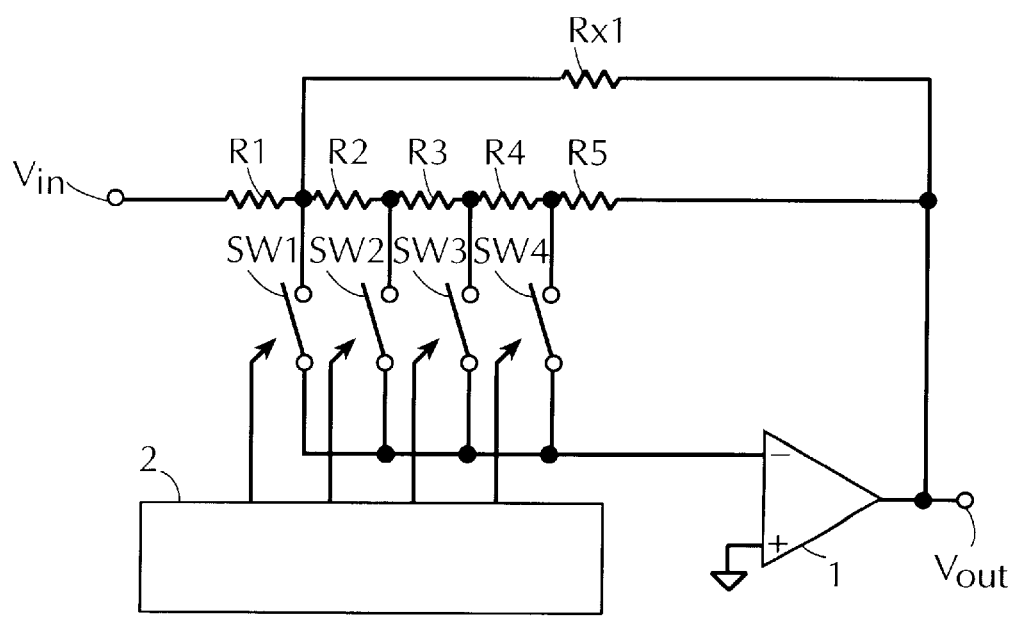
FIG. 71 is a table showing the resistance ratios of resistors included in the circuit shown in FIG. 70.
FIG. 72 is a diagram of another circuit in accordance with the invention.
Figures 73, 74A, 74B:
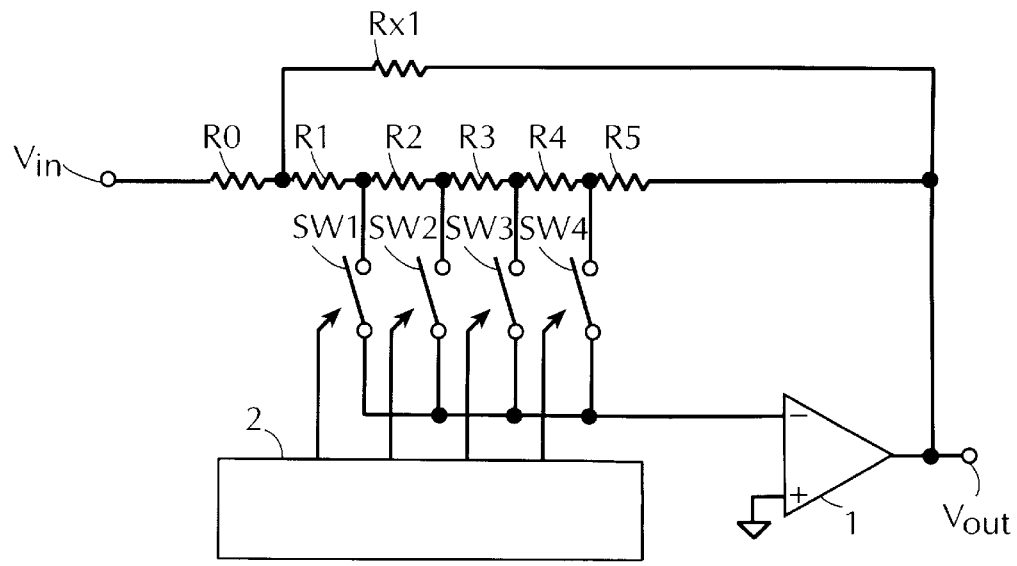
FIG. 73 is a diagram of another circuit in accordance with the invention.
FIGS. 74A and 74B are tables showing the resistance ratios of resistors included in the circuits shown in FIGS. 72 and 73, respectively.
Figures 75, 76:
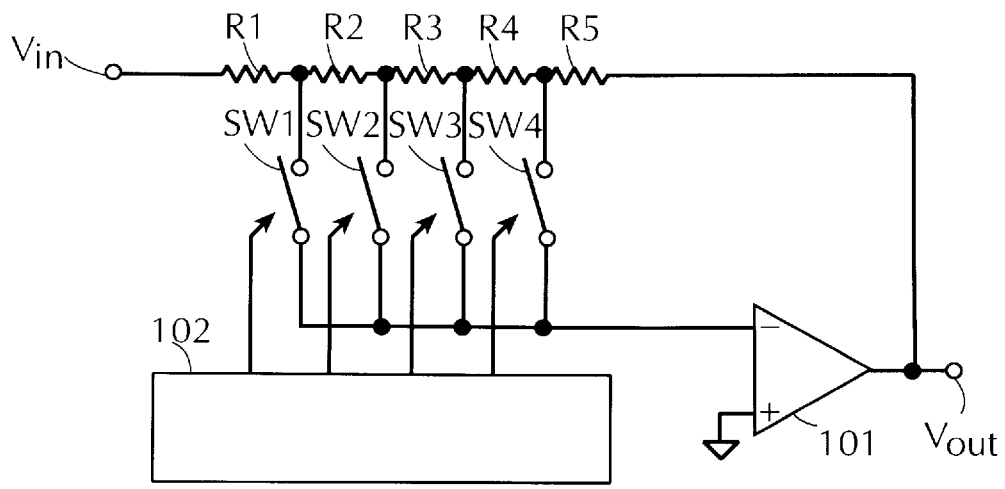
FIG. 75 is a diagram of a circuit that is equivalent to the circuits shown in FIGS. 72 and 73 but fabricated by the prior art technique.
FIG. 76 is a table showing the resistance ratios of resistors included in the circuit shown in FIG. 75.

It is assumed that closing the switches SW1–SW4 of the configurations shown in FIGS. 72 and 73 in turn produces ideal gains of –20 dB, –22 dB, –26 dB and –32 dB, respectively. The resistance ratios of the resistors may be set as listed in the tables of FIGS. 74(*a*) and 74(*b*) for these gains, respectively. FIGS. 74(*a*) and 74(*b*) correspond to FIGS. 72 and 73, respectively. FIG. 73 shows a specific example of the circuit shown in FIG. 42.

Where the prior art technique is utilized, a configuration as shown in FIG. 75 is obtained. Where the same ideal gains as the foregoing should be obtained, the various resistors assume resistance values as listed in the table of FIG. 76. Also, in this case, the resistance ratios of the various resistors are determined, assuming that the minimum resistance is 1.

Figures 77, 78:
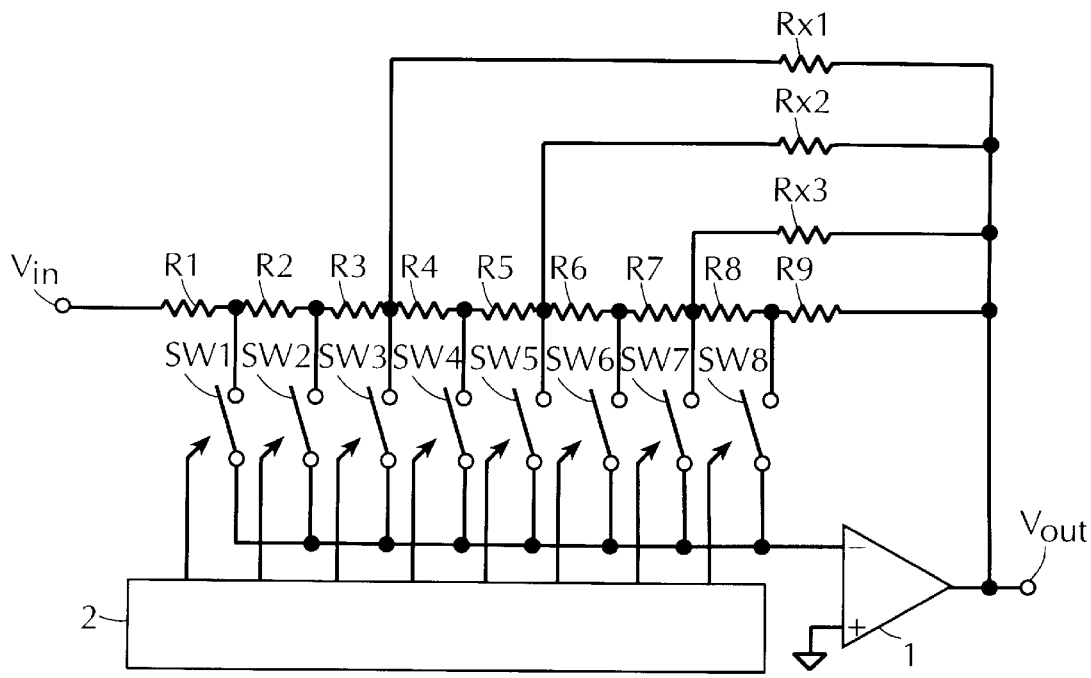
FIG. 77 is a diagram of another circuit in accordance with the invention.
FIG. 78 is a table showing the resistance ratios of resistors included in the circuit shown in FIG. 77.
Figures 79, 80:
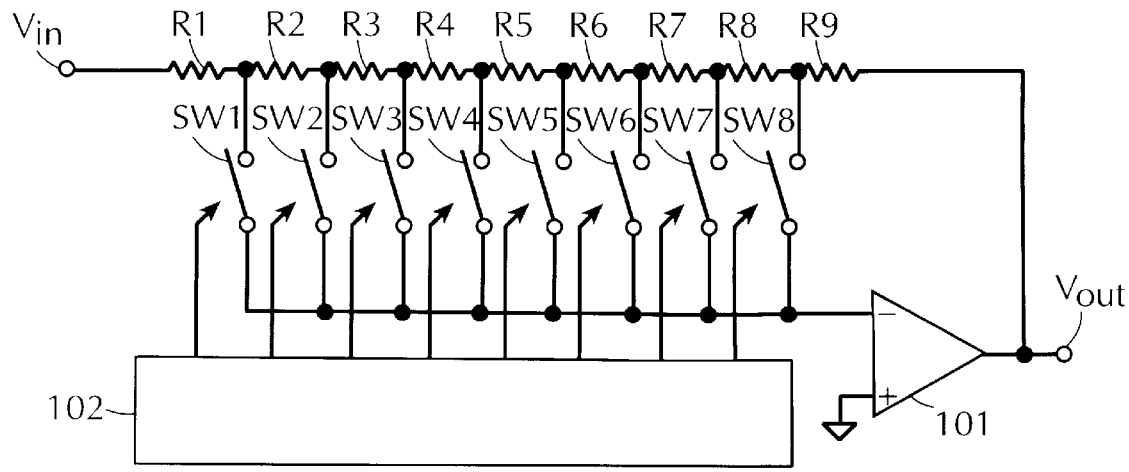
FIG. 79 is a diagram of a circuit that is equivalent to the circuit shown in FIG. 78 but fabricated by the prior art technique.
FIG. 80 is a table showing the resistance ratios of resistors included in the circuit shown in FIG. 79.
Figure 81:
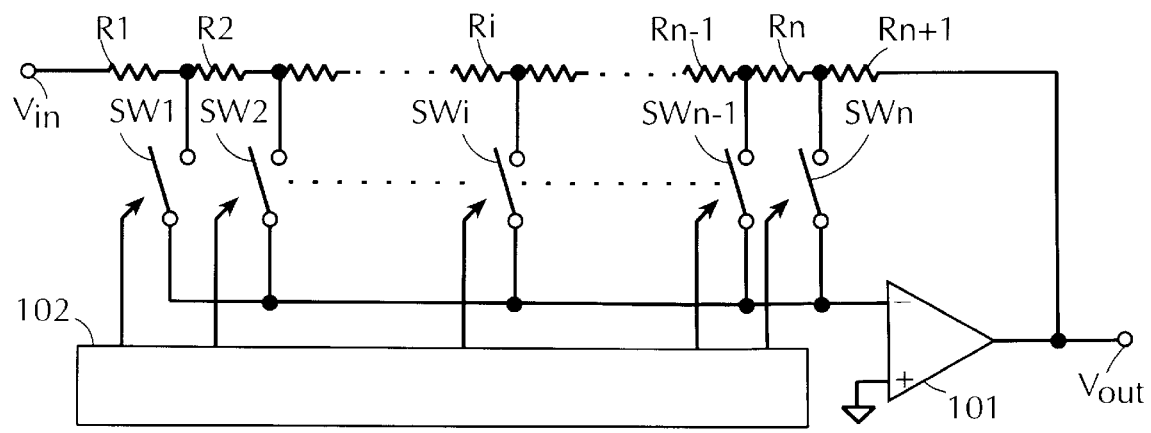
FIG. 81 is a diagram of a known circuit.
Figure 82:
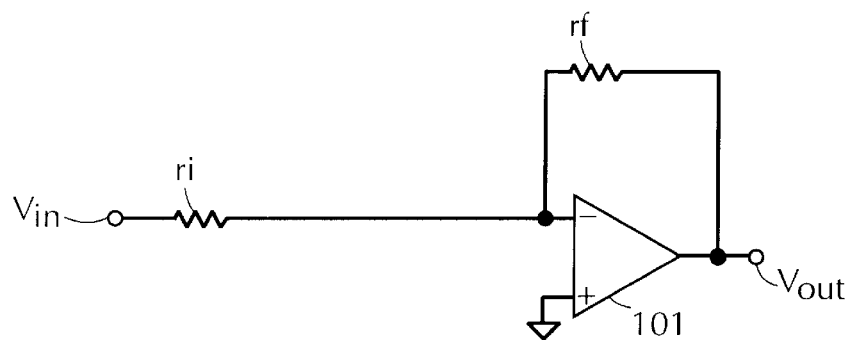
FIG. 82 is a diagram of a circuit equivalent to the circuit shown in FIG. 81.

It is assumed that closing the switches SW1–SW8 of the configuration shown in FIG. 77 in turn produces ideal gains of 0 dB, –10 dB, –20 dB, –30 dB, –40 dB, –50 dB, –60 dB and 70 dB, respectively. The resistance ratios of the resistors may be set, for example, as listed in the table of FIG. 78.

Where the prior art technique is utilized, a configuration as shown in FIG. 79 is obtained. Where the same ideal gains as the foregoing should be obtained, the various resistors assume resistance values as listed in the table of FIG. 80. Also, in this case, the resistance ratios of the various resistors are determined, assuming that the minimum resistance is 1.

In this way, the ratio of the total resistance to the minimum resistance can be made smaller than heretofore. Therefore, where a resistor is fabricated from a semiconductor resistive element whose minimum resistance size is limited, the area of the resistive portion can be made small. Where the same area as used conventionally is used, greater gain providing attenuation is obtained.

In the above examples of the variable-gain attenuator circuit, the first set of resistors consists of 3 to 9 resistors, and the second set of resistors consists of 1 to 3 resistors, in the same way as in the aforementioned examples of the variable-gain amplifier circuit. Some combinations of them are given in the descriptions of the above examples.

It is to be noted that the foregoing merely constitutes exemplary embodiments of the invention. In FIG. 41, the number of resistors of the first set (n+1) and the number of switches n are determined according to the required number of steps. The number of resistors of the second step m can be increased up to n–2. The positions of their junctions can be set at will between the junction of the resistors R2 and R3 and the junction of the resistors Rn and Rn+1.

The obtained gain of the circuit shown in FIG. 41 can be expressed in terms of the above equations, using the values of the various resistors, irrespective of the design of the circuit. The resistors can be set to appropriate values according to these equations.

We have derived a general formula (using n and m) expressing the relation of each resistance value to the gain of the configuration shown in FIG. 41. Since this general formula has an exorbitant number of items and can never be given in this specification, this formula is omitted herein.

In the circuit shown in FIG. 42, the number of resistors, the positions of the junctions, and the various resistance values can be appropriately set.

For the same gain, the present invention can make smaller the ratio of the total resistance to the minimum resistance than heretofore. Therefore, where a resistor is fabricated from a semiconductor resistive element whose minimum resistance size is limited, the area of the resistive portion can be made smaller. For the same area used, greater gain providing amplification or attenuation is obtained.

What is claimed is:

1. A variable-gain amplifier circuit comprising:

an operational amplifier having a gain and containing an inverting input terminal and an output terminal;

a first set of resistors fabricated on a semiconductor substrate, said resistors being connected in series, said first set of resistors having a first end connected with the output terminal of said operational amplifier and a second end forming a signal-input terminal of said variable-gain amplifier circuit, said resistors of said first set being connected to each other at junctions, all or some of said junctions forming first connectable junctions capable of being connected with said inverting input terminal of said operational amplifier;

a second set of resistors fabricated on said semiconductor substrate, each of said resistors of said second set having a first end connected with said signal-input terminal and a second end connected with a respective one of said junctions of said resistors of said first set; and a control means for controlling connection of said first connectable junctions with said inverting input terminal of said operational amplifier to control the gain of the operational amplifier.

2. A variable-gain attenuator circuit comprising:

an operational amplifier having a gain and containing an inverting input terminal and an output terminal;

a first set of resistors fabricated on a semiconductor substrate, said resistors being connected in series, said first set of resistors having a first end connected with the output terminal of said operational amplifier and a second end forming a signal-input terminal of said variable-gain attenuator circuit, said resistors of said first set being connected to each other at junctions, all or some of said junctions forming first connectable junctions capable of being connected with said inverting input terminal of said operational amplifier;

a second set of resistors fabricated on said semiconductor substrate, each of said resistors of said second set having a first end connected with the output terminal of said operational amplifier and a second end connected with a respective one of said first connectable junctions; and a control means for controlling connection of said first connectable junctions with said inverting input terminal to control the gain of the operational amplifier.

3. The circuit according to claim 1, wherein said control means connects only one of said junctions to said inverting input terminal of said operational amplifier.

4. The circuit according to claim 3, wherein said control means controls a switch means to connect said one of said junctions to said inverting input terminal of said operational amplifier.

5. The circuit according to claim 4, wherein the number of said switch means is represented by the variable n and the number of resistors comprising said first set of resistors is represented by the variable (n+1).

6. The circuit according to claim 5, wherein the number of resistors comprising said first set of resistors is greater than or equal to 3 and less than or equal to 9 resistors.

7. The circuit according to claim 5, wherein the number of resistors comprising said second set of resistors is at least one and can be increased up to the number represented by the variable (n−2).

8. The circuit according to claim 7, wherein the number of resistors comprising said second set of resistors is greater than or equal to 1 and less than or equal to 3 resistors.

9. The circuit according to claim 7, wherein said first set of resistors is fabricated on a semiconductor substrate.

10. The circuit according to claim 9, wherein said second set of resistors is fabricated on a semiconductor substrate.

11. The circuit according to claim 10, wherein a plurality of said junctions are connectable to said inverting input terminal by said control means to vary the amplification or attenuation of said circuit.

12. The circuit according to claim 10, wherein all of said junctions are connectable to said inverting input terminal of said operational amplifier by said control means to vary the amplification or attenuation provided by said circuit.

13. The circuit according to claim 2, wherein said control means connects only one of said junctions to said inverting input terminal of said operational amplifier.

14. The circuit according to claim 13, wherein said control means controls a switch means to connect said one of said junctions to said inverting input terminal of said operational amplifier.

15. The circuit according to claim 14, wherein the number of said switch means is represented by the variable n and the number of resistors comprising said first set of resistors is represented by the variable (n+1).

16. The circuit according to claim 15, wherein the number of resistors comprising said first set of resistors is greater than or equal to 3 and less than or equal to 9 resistors.

17. The circuit according to claim 15, wherein the number of resistors comprising said second set of resistors is at least one and can be increased up to the number represented by the variable (n−2).

18. The circuit according to claim 17, wherein the number of resistors comprising said second set of resistors is greater than or equal to 1 and less than or equal to 3 resistors.

19. The circuit according to claim 17, wherein said first set of resistors is fabricated on a semiconductor substrate.

20. The circuit according to claim 19, wherein said second set of resistors is fabricated on a semiconductor substrate.

21. The circuit according to claim 20, wherein a plurality of said junctions are connectable to said inverting input terminal by said control means to vary the amplification or attenuation of said circuit.

22. The circuit according to claim 20, wherein all of said junctions are connectable to said inverting input terminal of said operational amplifier by said control means to vary the amplification or attenuation provided by said circuit.

* * * * *